US012677629B2

(12) United States Patent
Neumann et al.

(10) Patent No.: US 12,677,629 B2
(45) Date of Patent: Jul. 7, 2026

(54) MAGNETIC SENSOR ASSEMBLY FOR A SUBSTRATE PROCESS STATION

(71) Applicant: Applied Materials, Inc., Santa Clara, CA (US)

(72) Inventors: Erich Neumann, Dresden (DE); Konstantin Konle, Dresden (DE)

(73) Assignee: Applied Materials, Inc., Santa Clara, CA (US)

( * ) Notice: Subject to any disclaimer, the term of this patent is extended or adjusted under 35 U.S.C. 154(b) by 197 days.

(21) Appl. No.: 18/735,485

(22) Filed: Jun. 6, 2024

(65) Prior Publication Data

US 2025/0379078 A1    Dec. 11, 2025

(51) Int. Cl.
| | |
|---|---|
| *H10P 72/00* | (2026.01) |
| *G01R 33/00* | (2006.01) |
| *G01R 33/09* | (2006.01) |
| *H10P 72/30* | (2026.01) |

(52) U.S. Cl.
CPC ...... *H10P 72/0608* (2026.01); *G01R 33/0094* (2013.01); *G01R 33/091* (2013.01); *H10P 72/3204* (2026.01)

(58) Field of Classification Search
None
See application file for complete search history.

(56) References Cited

U.S. PATENT DOCUMENTS

| | | | |
|---|---|---|---|
| 5,180,048 A | 1/1993 | Kawada et al. | |
| 5,569,350 A | 10/1996 | Osada et al. | |

| | | | |
|---|---|---|---|
| 5,641,054 A | 6/1997 | Mori et al. | |
| 6,157,106 A | 12/2000 | Tietz et al. | |
| 6,206,176 B1 | 3/2001 | Blonigan et al. | |
| 6,231,716 B1 | 5/2001 | White et al. | |
| 7,293,950 B2 | 11/2007 | Bonora et al. | |

(Continued)

FOREIGN PATENT DOCUMENTS

| | | |
|---|---|---|
| CN | 101158852 A | 4/2008 |
| CN | 113707585 A | 11/2021 |

(Continued)

OTHER PUBLICATIONS

U.S. Appl. No. 18/081,493, filed Dec. 14, 2022.

(Continued)

*Primary Examiner* — Jas A Sanghera

(74) *Attorney, Agent, or Firm* — Patterson + Sheridan, LLP

(57) ABSTRACT

A process station includes: a housing; a membrane disposed in the housing, the membrane isolating a first region within the housing from a second region within the housing; a first magnetic levitation actuator assembly disposed in the first region, the first magnetic levitation assembly including: a plurality of stators configured to levitate and drive a carrier within the second region; a plurality of sensor assemblies, each sensor assembly including: a first sensor configured to detect a first distance between the membrane and a first portion of a first upper surface of a first sinusoidal element of the carrier, the first upper surface defining a sinusoidal profile; and a second sensor configured to detect a second distance between the membrane and a second portion of the first upper surface of the first sinusoidal element, and wherein the second sensor is spaced apart from the first sensor by a spacing distance.

20 Claims, 12 Drawing Sheets

(56) References Cited

U.S. PATENT DOCUMENTS

| | | | |
|---|---|---|---|
| 7,438,175 B2 | 10/2008 | White et al. | |
| 7,841,820 B2 | 11/2010 | Bonora et al. | |
| 7,948,122 B2 | 5/2011 | Compter et al. | |
| 7,964,038 B2 | 6/2011 | Patalay et al. | |
| 7,994,486 B2 | 8/2011 | Smick et al. | |
| 8,104,951 B2 | 1/2012 | Aderhold et al. | |
| 8,851,817 B2 | 10/2014 | Bonora et al. | |
| 9,390,950 B2 | 7/2016 | Sorabji et al. | |
| 9,588,443 B2 | 3/2017 | Shibazaki | |
| 9,964,863 B1 | 5/2018 | Babayan et al. | |
| 10,204,810 B2 | 2/2019 | Hoey et al. | |
| 10,236,197 B2 | 3/2019 | Janakiraman et al. | |
| 10,256,124 B2 | 4/2019 | Mooring | |
| 10,262,887 B2 | 4/2019 | Hao et al. | |
| 10,283,397 B2 | 5/2019 | Willwerth et al. | |
| 10,460,977 B2 | 10/2019 | Breninger et al. | |
| 10,483,141 B2 | 11/2019 | Janakiraman et al. | |
| 10,490,436 B2 | 11/2019 | Ghosh et al. | |
| 10,734,265 B2 | 8/2020 | Janakiraman et al. | |
| 10,770,337 B2 | 9/2020 | Lee et al. | |
| 10,784,142 B2 | 9/2020 | Marcelynas et al. | |
| 10,851,453 B2 | 12/2020 | Tsai et al. | |
| 10,892,180 B2 | 1/2021 | Chia et al. | |
| 11,232,965 B2 | 1/2022 | Newman et al. | |
| 11,377,310 B2 | 7/2022 | Aust et al. | |
| 11,508,595 B2 | 11/2022 | Aust et al. | |
| 11,527,424 B2 | 12/2022 | Berger et al. | |
| 2002/0018842 A1 | 2/2002 | Dunlow | |
| 2002/0108842 A1 | 8/2002 | Bonora et al. | |
| 2003/0178145 A1 | 9/2003 | Anderson et al. | |
| 2003/0219977 A1 | 11/2003 | Pomarede et al. | |
| 2004/0023495 A1 | 2/2004 | Butterfield et al. | |
| 2004/0058293 A1 | 3/2004 | Nguyen et al. | |
| 2004/0255442 A1 | 12/2004 | McDiarmid et al. | |
| 2006/0102078 A1 | 5/2006 | Fairbairn et al. | |
| 2006/0156981 A1 | 7/2006 | Fondurulia et al. | |
| 2007/0160507 A1 | 7/2007 | Satoh et al. | |
| 2007/0269297 A1 | 11/2007 | Meulen et al. | |
| 2008/0175694 A1 | 7/2008 | Park et al. | |
| 2008/0232947 A1 | 9/2008 | van der Meulen et al. | |
| 2008/0266037 A1 | 10/2008 | Williams | |
| 2009/0314211 A1 | 12/2009 | Du Bois et al. | |
| 2010/0062592 A1 | 3/2010 | Clark | |
| 2010/0136773 A1 | 6/2010 | Akae et al. | |
| 2010/0226737 A1 | 9/2010 | Sakaue et al. | |
| 2011/0312189 A1 | 12/2011 | Kim et al. | |
| 2012/0109355 A1 | 5/2012 | Baccini et al. | |
| 2012/0213614 A1 | 8/2012 | Bonora et al. | |
| 2012/0249291 A1 | 10/2012 | Holcomb et al. | |
| 2013/0171757 A1 | 7/2013 | Ponnekanti et al. | |
| 2014/0020629 A1 | 1/2014 | Tsai et al. | |
| 2018/0339816 A1 | 11/2018 | Oldendorf et al. | |
| 2018/0374732 A1 | 12/2018 | Klein et al. | |
| 2019/0348264 A1 | 11/2019 | Tsai et al. | |
| 2020/0026060 A1 | 1/2020 | Takato | |
| 2020/0064156 A1 | 2/2020 | Hirano et al. | |
| 2020/0232088 A1 | 7/2020 | White et al. | |
| 2020/0262060 A1 | 8/2020 | Hosek et al. | |
| 2020/0262660 A1 | 8/2020 | Hosek et al. | |
| 2020/0381276 A1 | 12/2020 | Yedla et al. | |
| 2021/0024929 A1 | 1/2021 | Yokota et al. | |
| 2021/0249291 A1 | 8/2021 | Raatz et al. | |
| 2021/0265188 A1 | 8/2021 | Moura et al. | |
| 2021/0296150 A1 | 9/2021 | Berger et al. | |
| 2021/0328146 A1 | 10/2021 | Heymanns et al. | |
| 2021/0354934 A1 | 11/2021 | Aust et al. | |
| 2021/0358788 A1 | 11/2021 | Berger et al. | |
| 2021/0398833 A1 | 12/2021 | Ahn | |
| 2022/0003718 A1 | 1/2022 | Watanabe | |
| 2022/0013383 A1 | 1/2022 | Savandaiah et al. | |
| 2022/0037181 A1 | 2/2022 | Hatano et al. | |
| 2022/0130700 A1 | 4/2022 | Newman et al. | |
| 2022/0208426 A1* | 6/2022 | Aust | H01F 7/0236 |
| 2022/0293451 A1 | 9/2022 | Sulyman et al. | |
| 2022/0293452 A1 | 9/2022 | Sulyman et al. | |
| 2022/0336258 A1 | 10/2022 | Srivastava et al. | |
| 2022/0393618 A1 | 12/2022 | Aust et al. | |
| 2022/0415635 A1 | 12/2022 | Yedla et al. | |
| 2022/0415687 A1 | 12/2022 | Hatano et al. | |
| 2022/0415688 A1 | 12/2022 | Hatano et al. | |
| 2023/0132174 A1 | 4/2023 | Thanu et al. | |

FOREIGN PATENT DOCUMENTS

| | | | |
|---|---|---|---|
| DE | 102018006259 A1 | 12/2019 | |
| EP | 1681261 A1 | 7/2006 | |
| EP | 4222779 A1 | 8/2023 | |
| JP | 62121134 A | 6/1987 | |
| JP | H06324297 A | 11/1994 | |
| KR | 10-20210081597 A | 7/2021 | |
| KR | 20220099611 A | 7/2022 | |
| TW | 202141675 A | 11/2021 | |
| WO | 2008077048 A2 | 6/2008 | |
| WO | 2011102410 A1 | 8/2011 | |
| WO | 2015007385 A1 | 1/2015 | |
| WO | 2015043712 A1 | 4/2015 | |
| WO | 2015140155 A1 | 9/2015 | |
| WO | 2015158725 A1 | 10/2015 | |
| WO | 2015162177 A1 | 10/2015 | |
| WO | 2015189263 A1 | 12/2015 | |
| WO | 2016162288 A1 | 10/2016 | |
| WO | 2019037858 A1 | 2/2019 | |
| WO | 2019052657 A1 | 3/2019 | |
| WO | 2019145035 A1 | 8/2019 | |
| WO | 2019238416 A1 | 12/2019 | |
| WO | 2020126040 A1 | 6/2020 | |
| WO | 2020192911 A1 | 10/2020 | |
| WO | 2021106796 A1 | 6/2021 | |
| WO | 2021106799 A1 | 6/2021 | |
| WO | 2021223843 A1 | 11/2021 | |
| WO | 2022044834 A1 | 3/2022 | |

OTHER PUBLICATIONS

U.S. Appl. No. 18/141,909, filed May 1, 2023.

U.S. Appl. No. 18/141,914, filed May 1, 2023.

U.S. Appl. No. 18/141,920, filed May 1, 2023.

U.S. Appl. No. 18/141,923, filed May 1, 2023.

U.S. Appl. No. 18/141,926, filed May 1, 2023.

U.S. Appl. No. 18/141,931, filed May 1, 2023.

International Search Report and Written Opinion in related application PCT/US2023/035709 dated Feb. 5, 2024.

International Search Report/ Written Opinion issued to PCT/US2023/079455 on Mar. 6, 2024.

Yu et al.; Controller design and implementation of six-degree-of-freedom magnetically levitated positioning system with high precision; Proc. IMechE vol. 222 Part I: J. Systems and Control Engineering; 12 pages.

Zhu et al; Design and Control of a Six Degrees-of-Freedom Magnetically Levitated Positioning System; IFAC PapersOnLine 49-21 (2016) pp. 127-132.

Temposonics; Sensor Selector Guide; Retrieved from the Internet at: < https://www.temposonics.com/docs/temposonicslibraries/literature/sensor_selector_guide_industrial_551814_en.pdf?sfvrsn=5fde8874_12>; 21 pages.

Linear Motion Tips; How do Magnetostrictive sensors work ?; Retrieved from the Internet at: <https://www.linearmotiontips.com/how-do-magnetostrictive-sensors-work/> 9 Pages.

U.S. Appl. No. 18/607,043, filed Mar. 15, 2024.

U.S. Appl. No. 18/517,404, filed Nov. 22, 2023.

U.S. Appl. No. 18/377,572, filed Oct. 6, 2023.

U.S. Appl. No. 18/433,993, filed Feb. 6, 2024.

U.S. Appl. No. 18/081,493, filed Nov. 2, 2023.

U.S. Appl. No. 18/417,510, filed Jan. 19, 2024.

U.S. Appl. No. 18/417,510, filed Oct. 2, 2023.

U.S. Appl. No. 29/904,232, filed Oct. 24, 2023.

U.S. Appl. No. 18/241,840, filed Sep. 1, 2023.

U.S. Appl. No. 18/651,146, filed Apr. 30, 2024.

U.S. Appl. No. 18/651,243, filed Apr. 30, 2024.

U.S. Appl. No. 18/651,213, filed Apr. 30, 2024.

(56) References Cited

OTHER PUBLICATIONS

U.S. Appl. No. 18/661,286, filed May 10, 2024.
U.S. Appl. No. 18/661,346, filed May 10, 2024.
U.S. Appl. No. 18/732,456, filed Jun. 3, 2024.
U.S. Appl. No. 18/732,468, filed Jun. 3, 2024.
U.S. Appl. No. 18/732,478, filed Jun. 3, 2024.
International Search Report and Written Opinion issued to Application No. PCT/US2025/031195 on Sep. 17, 2025 in 8 pages.

* cited by examiner

MAGNETIC SENSOR ASSEMBLY FOR A SUBSTRATE PROCESS STATION

BACKGROUND

Field

Embodiments of the present disclosure generally relate to a magnetic sensor for detecting a position of a magnetically levitated carrier.

Description of the Related Art

Semiconductor devices are typically formed on semiconductor substrates using processing systems which include several process chambers, where each process chamber is used to complete one or more of the various steps (e.g., depositions) to form the semiconductor devices (e.g., a memory chip). Processing systems may use substrate transfer systems to move substrates between each of the process chambers. The process chambers and the substrate transfer system of the processing system may each be held at vacuum during processing. Substrate transfer systems may utilize a magnetically levitated carrier to move the substrates through and between each of the process chambers. However, precise, reliable, and smooth transportation of the carriers into and out of each of the process chambers during the various steps used to form semiconductor devices may be challenging. Conventional magnetic sensors generate magnetic fields that interfere with the ability of the substrate transfer system to levitate and convey the carrier.

Accordingly, there exists in the art a need for an improved magnetic sensor to detect a position of a magnetically levitated carrier without adversely impacting the ability of the substrate transfer system to levitate and convey substrates disposed within the carrier.

SUMMARY

In one embodiment, a process station comprises: a housing; a membrane disposed in the housing, the membrane isolating a first region within the housing from a second region within the housing; a first magnetic levitation actuator assembly disposed in the first region, the first magnetic levitation assembly including: a plurality of stators configured to levitate and drive a carrier within the second region; a plurality of sensor assemblies, each sensor assembly including: a first sensor configured to detect a first distance between the membrane and a first portion of a first upper surface of a first sinusoidal element of the carrier, the first upper surface defining a sinusoidal profile; and a second sensor configured to detect a second distance between the membrane and a second portion of the first upper surface of the first sinusoidal element, and wherein the second sensor is spaced apart from the first sensor by a spacing distance.

In one embodiment, a magnetic levitation actuator assembly comprises: a linear stator; a first sensor assembly positioned adjacent to the linear stator, the first sensor assembly comprising a first sensor and a second sensor, the first sensor spaced apart from the second sensor by a spacing distance, wherein the first sensor and second sensor are each a magnetic sensor, the magnetic sensor comprising: at least one magnet disposed on a first side of a base, the at least one magnet generating a magnetic flux; and a first sensor element and a second sensor element disposed on a second side of the base, wherein the first sensor element and second sensor element are configured to measure magnetic flux density, wherein the magnetic flux generated by the at least one magnet is configured to pass through the first sensor element in a first direction and pass through the second sensor element in a second direction that is opposite to the first direction.

In one embodiment, a method of operating a process station comprises: levitating a carrier with a plurality of linear stators of a magnetic levitation actuator assembly, wherein the magnetic levitation actuator assembly further comprises a first sensor assembly, and wherein a membrane is disposed between the carrier and the magnetic levitation actuator assembly; and detecting a horizontal position of the carrier using the first sensor assembly, wherein the first sensor assembly is disposed above an upper surface of a sinusoidal element coupled to the carrier, and wherein the upper surface is defined by a sinusoidal profile.

In one embodiment, a carrier comprises: a base; a first linear array of features coupled to the base; a first sinusoidal element coupled to the base and extending parallel to the first linear array of features, the first sinusoidal element including a first upper surface defining a first sinusoidal profile; and at least one support surface coupled to the base, the at least one support surface configured to support an object.

In one embodiment, a carrier comprises: a base; a first linear array of features coupled to the base; a first sinusoidal element coupled to the base and extending parallel to the first linear array, the first sinusoidal element including a first upper surface defining a first sinusoidal profile; a first featureless element coupled to the base and extending parallel to the first sinusoidal element, the first featureless element including a first planar upper surface; and at least one support surface coupled to the base, the at least one support surface configured to support an object.

In one embodiment, a carrier comprises: a base including a first side and a second side; a first magnetic levitation element coupled to the first side of the base, the first magnetic levitation element including a first linear array of features and a first sinusoidal element, wherein the first sinusoidal element includes a first upper surface defining a first sinusoidal profile; a second magnetic levitation element coupled to the first side of the base, the second magnetic levitation element including a second linear array of features and a second sinusoidal element, wherein the second sinusoidal element includes a second upper surface defining a second sinusoidal profile, and wherein the first magnetic levitation element and the second magnetic levitation element are aligned in a first direction; a first support member coupled to the second side of the base; and a second support member coupled to the second side of the base, wherein the first support member and the second support member are disposed below the first magnetic levitation element and the second magnetic levitation element, and wherein the first support member and the second support member are configured to support an object.

In one embodiment, a method of determining a position of a carrier within a process station comprises: levitating a carrier within a process station, wherein the process station includes a membrane separating a first region of the process station from a second region of the process station, wherein the carrier is levitated in the second region, and wherein a first sensor assembly is disposed above a sinusoidal element of the carrier, the first sensor assembly comprising a first sensor, a second sensor, and a third sensor arranged in a linear array and spaced apart by a spacing distance; outputting a first signal from the first sensor based on a first detected magnetic flux density; outputting a second signal from the second sensor based on a second detected magnetic flux density; outputting a third signal from the third sensor based on a third detected magnetic flux density; averaging the first signal, second signal, and third signal to determine an average signal; and determining a first vertical position of the carrier within the second region by correlating the average signal to a size of a median gap between an underside of the membrane and a mid-line of a sinusoidal profile of the sinusoidal element.

In one embodiment, a method of determining a position of a carrier within a process station comprises: levitating a carrier within a process station, wherein the process station includes a membrane separating a first region of the process station from a second region of the process station, wherein the carrier is levitated in the second region, and wherein a first sensor assembly is disposed above a sinusoidal element having a sinusoidal profile positioned on the carrier, the first sensor assembly comprising a first sensor, a second sensor, and a third sensor arranged in a linear array and spaced apart by a spacing distance; outputting a first signal from the first sensor based on a first detected magnetic flux density over a time interval; outputting a second signal from the second sensor based on a second detected magnetic flux density over the time interval; outputting a third signal from the third sensor based on a third detected magnetic flux density over the time interval; inputting the first signal, second signal, and third signal into a Clarke transformation to generate a sine signal and a cosine signal; inputting the sine signal and cosine signal into a sine-cosine decoder to generate a sawtooth signal; and analyzing the sawtooth signal to determine a distance traveled by the carrier within the second region.

In one embodiment, a method of determining a position of a carrier within a process station comprises: levitating a carrier within a process station, wherein the process station includes a membrane separating a first region of the process station from a second region of the process station, wherein the carrier is levitated in the second region, and wherein a first sensor assembly is disposed above a sinusoidal element having a sinusoidal profile positioned on the carrier, and a vertical position sensor is disposed in the second region above a featureless element; outputting a first signal from a first sensor of the first sensor assembly, the first signal based on a first detected magnetic flux density; outputting a second signal from a second sensor of the first sensor assembly, the second signal based on a second detected magnetic flux density, and wherein the second sensor is spaced apart from the first sensor by a spacing distance; outputting a third signal from the vertical position sensor, the third signal based on a third detected magnetic flux density; analyzing the first signal and the second signal to determine a horizontal position of the carrier in the second region; and analyzing the third signal to determine a vertical position of the carrier.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

4

Figures 1, 2A, 2B:
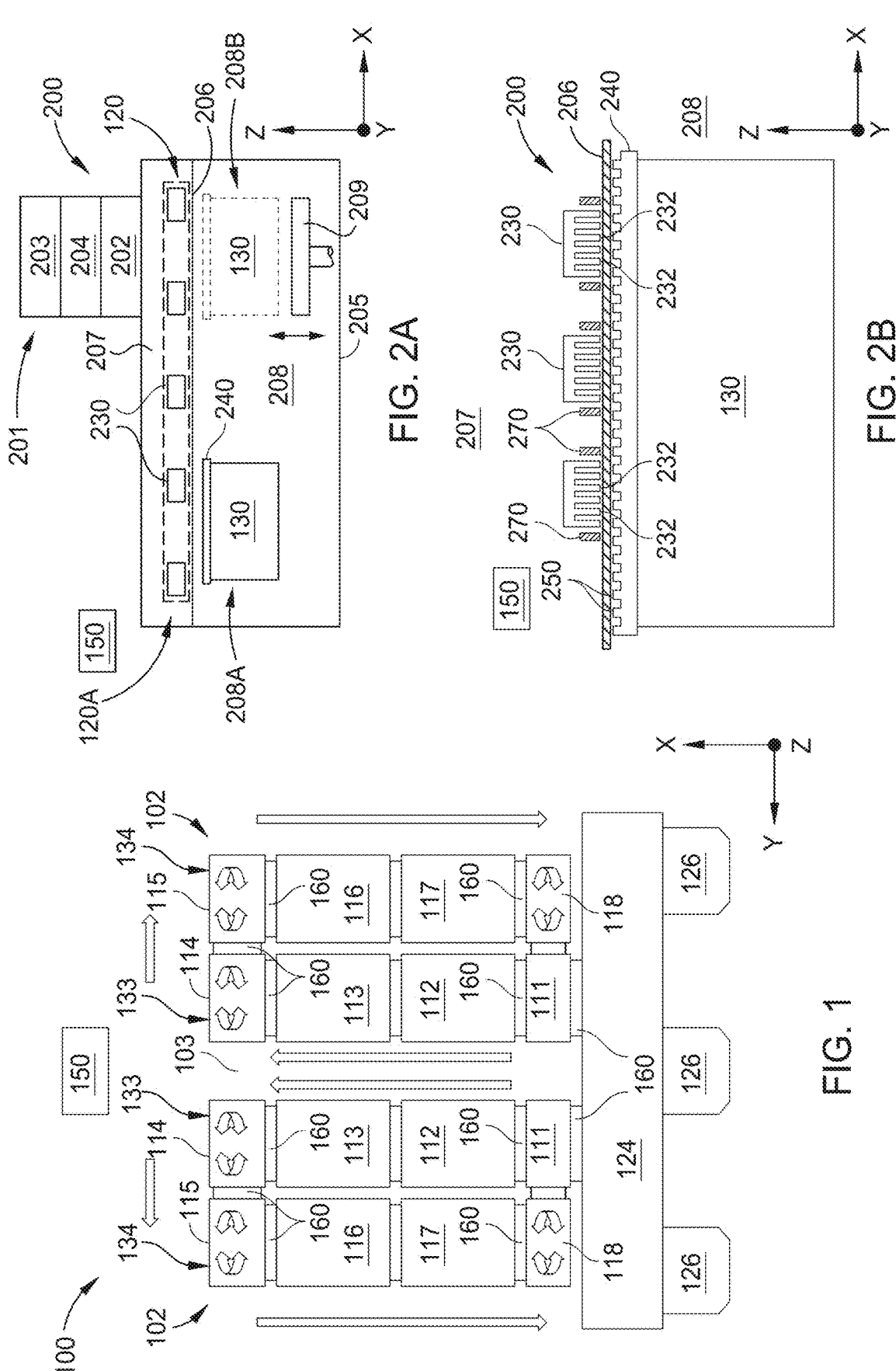

FIG. 1 illustrates a top schematic view of an example substrate processing system, in which embodiments of the present disclosure may be implemented.

FIG. 2A illustrates a side view of a portion of an example station of the substrate processing system of FIG. 1, in which embodiments of the present disclosure may be implemented.

FIG. 2B illustrates a side view of a portion of an example station of the substrate processing system of FIG. 1, in which embodiments of the present disclosure may be implemented.

Figure 2C:
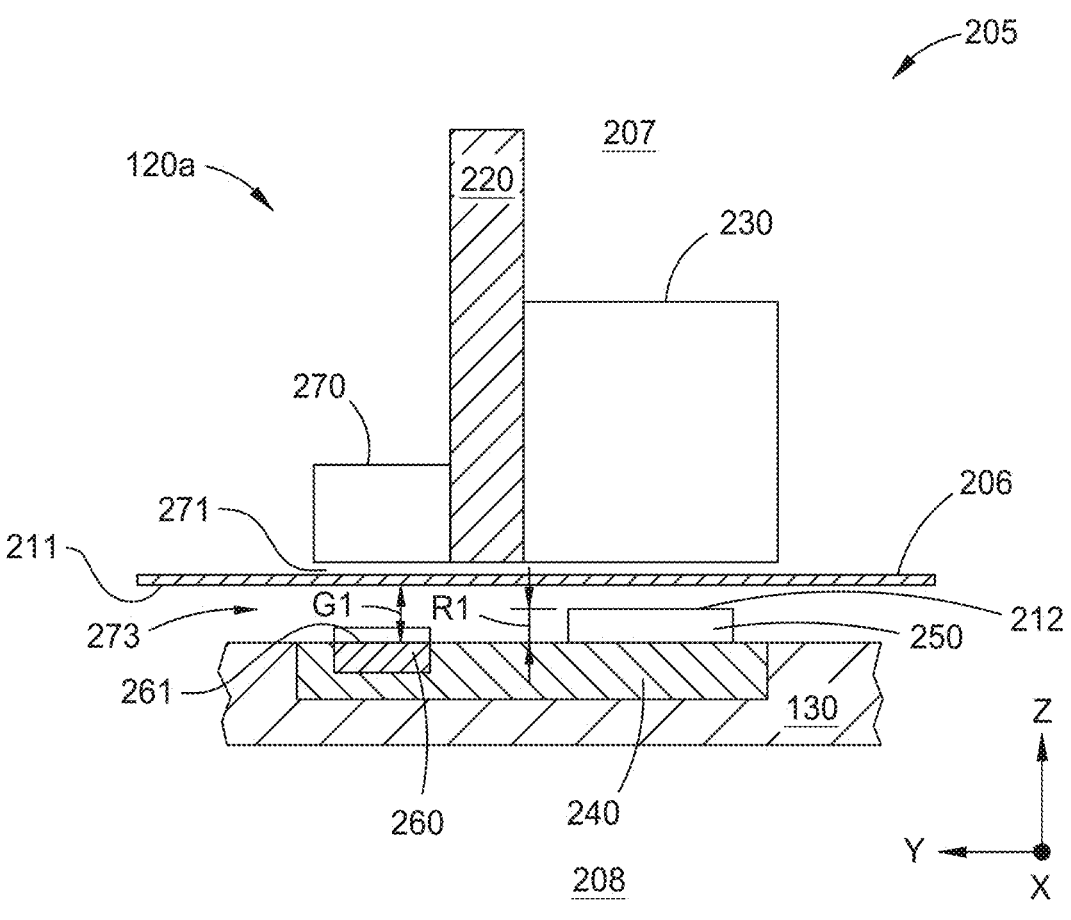

FIG. 2C illustrates a schematic partial cross-sectional view of the portion shown in FIG. 2B, in which embodiments of the present disclosure may be implemented.

Figure 2D:
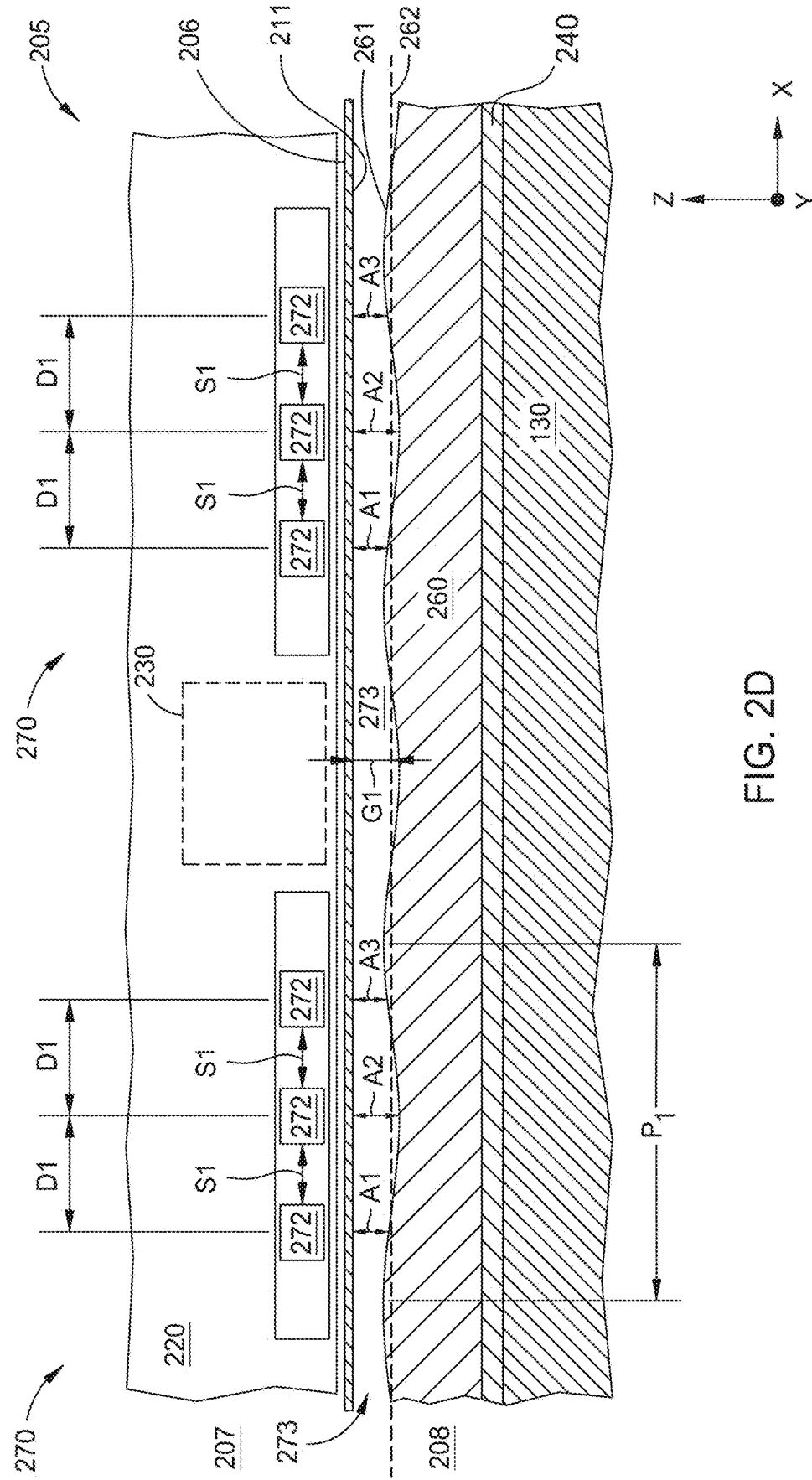

FIG. 2D is a schematic side view of the portion shown in FIG. 2B, in which embodiments of the present disclosure may be implemented.

Figures 3A, 3B:
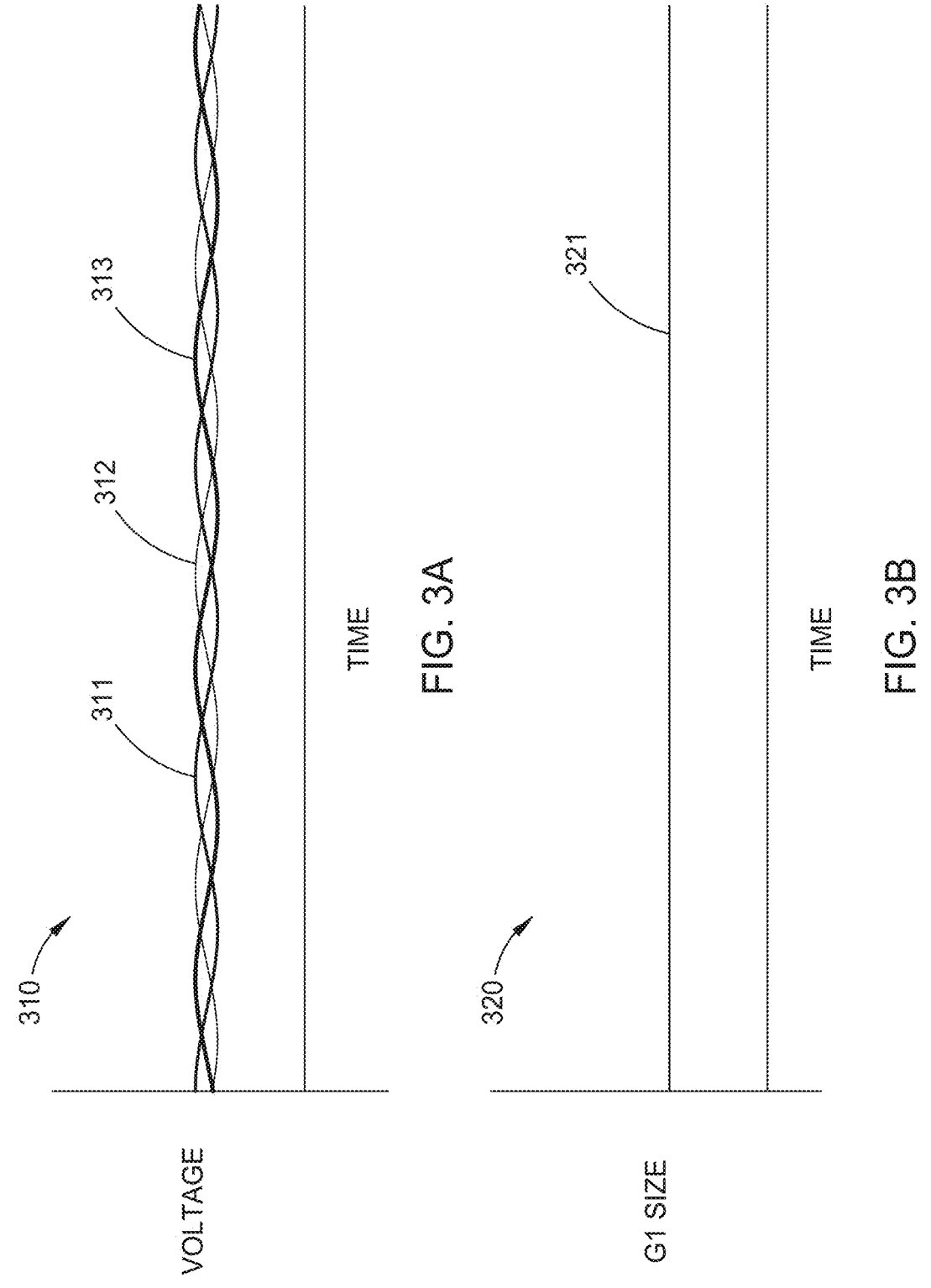

FIG. 3A illustrates an exemplary graph showing the voltage outputs of three sensors of a sensor assembly over time, in which embodiments of the present disclosure may be implemented.

FIG. 3B illustrates an exemplary graph showing the median gap over time detected by the sensor assembly based on the voltage outputs shown in FIG. 3A, in which embodiments of the present disclosure may be implemented.

Figures 3C, 3D:
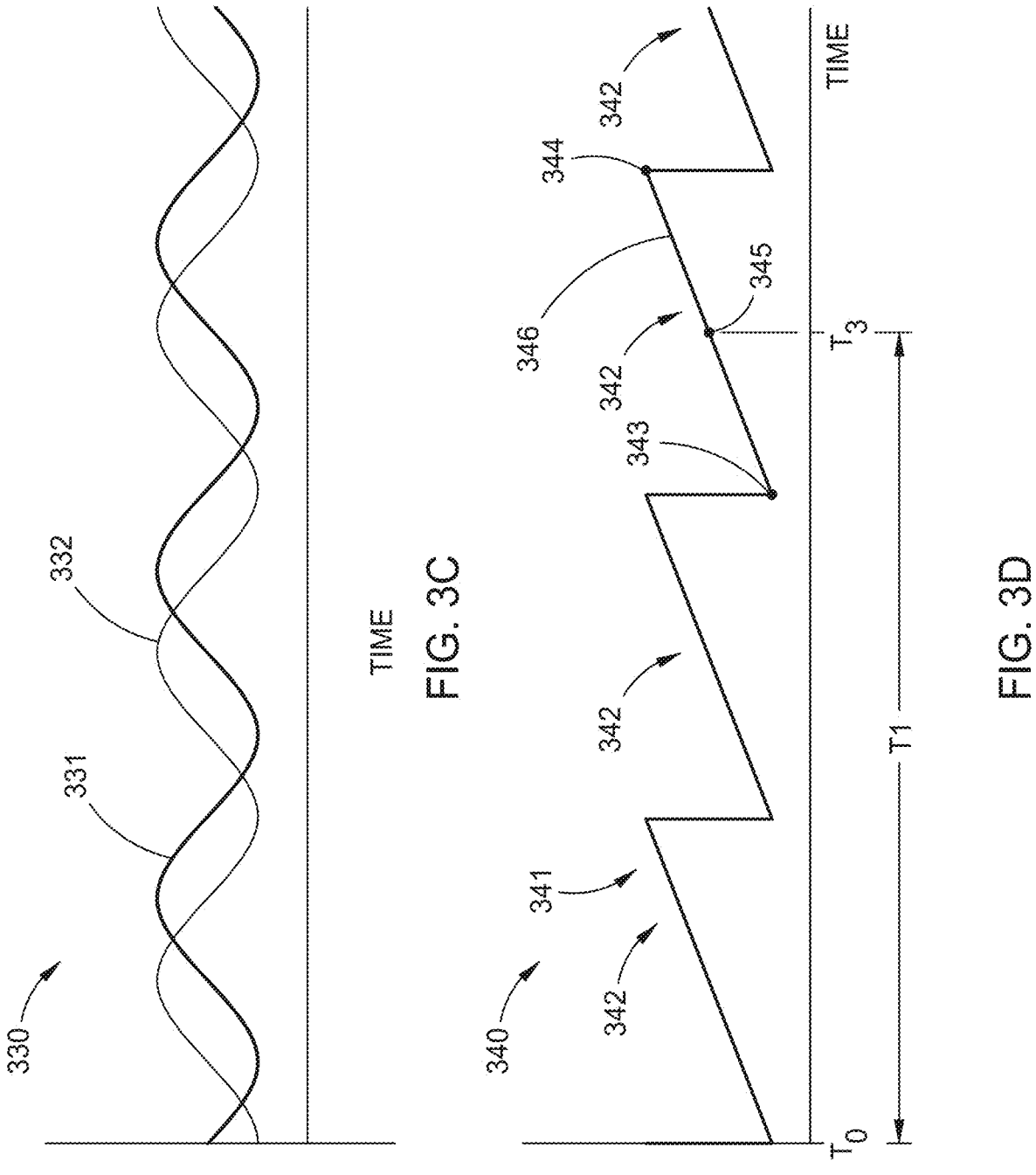

FIG. 3C illustrates an exemplary graph showing a sine signal and a cosine signal resulting from inputting the voltage outputs shown in FIG. 3A into a Clarke transformation, in which embodiments of the present disclosure may be implemented.

FIG. 3D illustrates an exemplary graph showing a sawtooth signal generated by inputting the sine and cosine signals shown in FIG. 3C into a sine-cosine decoder, in which embodiments of the present disclosure may be implemented.

Figure 4:
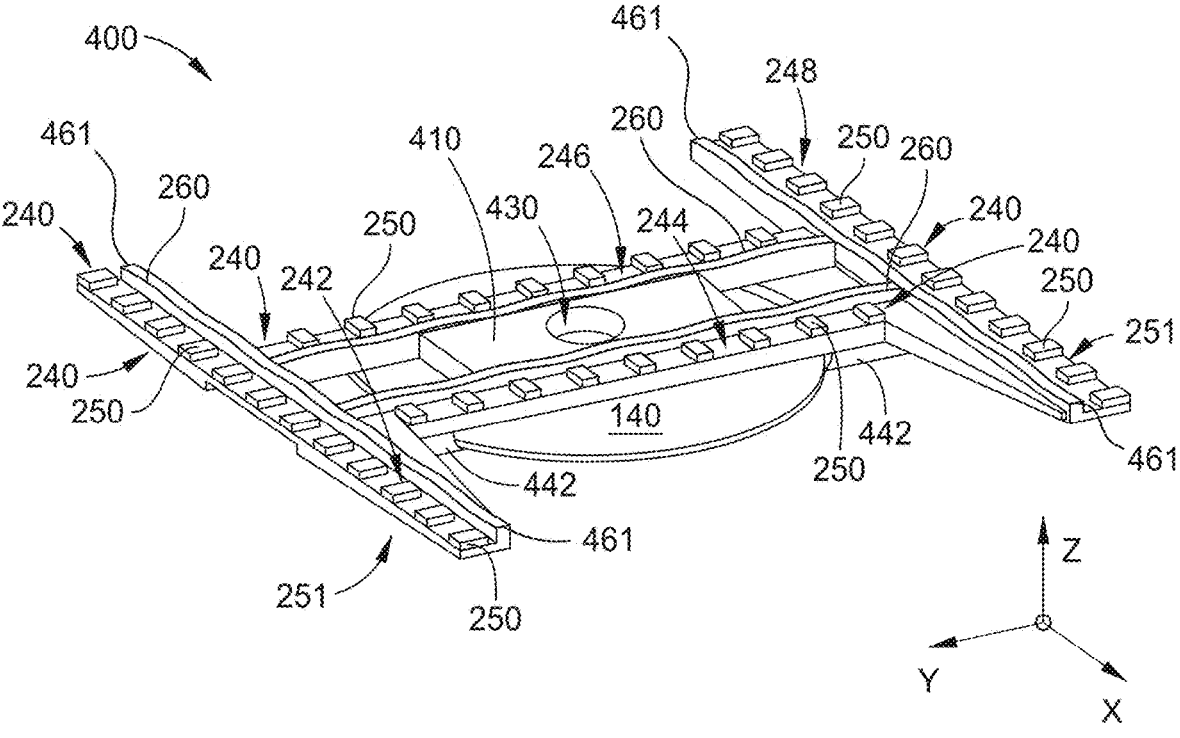

FIG. 4 illustrates an example carrier that includes a base and magnetic levitation elements, in accordance with embodiments of the present disclosure.

Figure 5A:
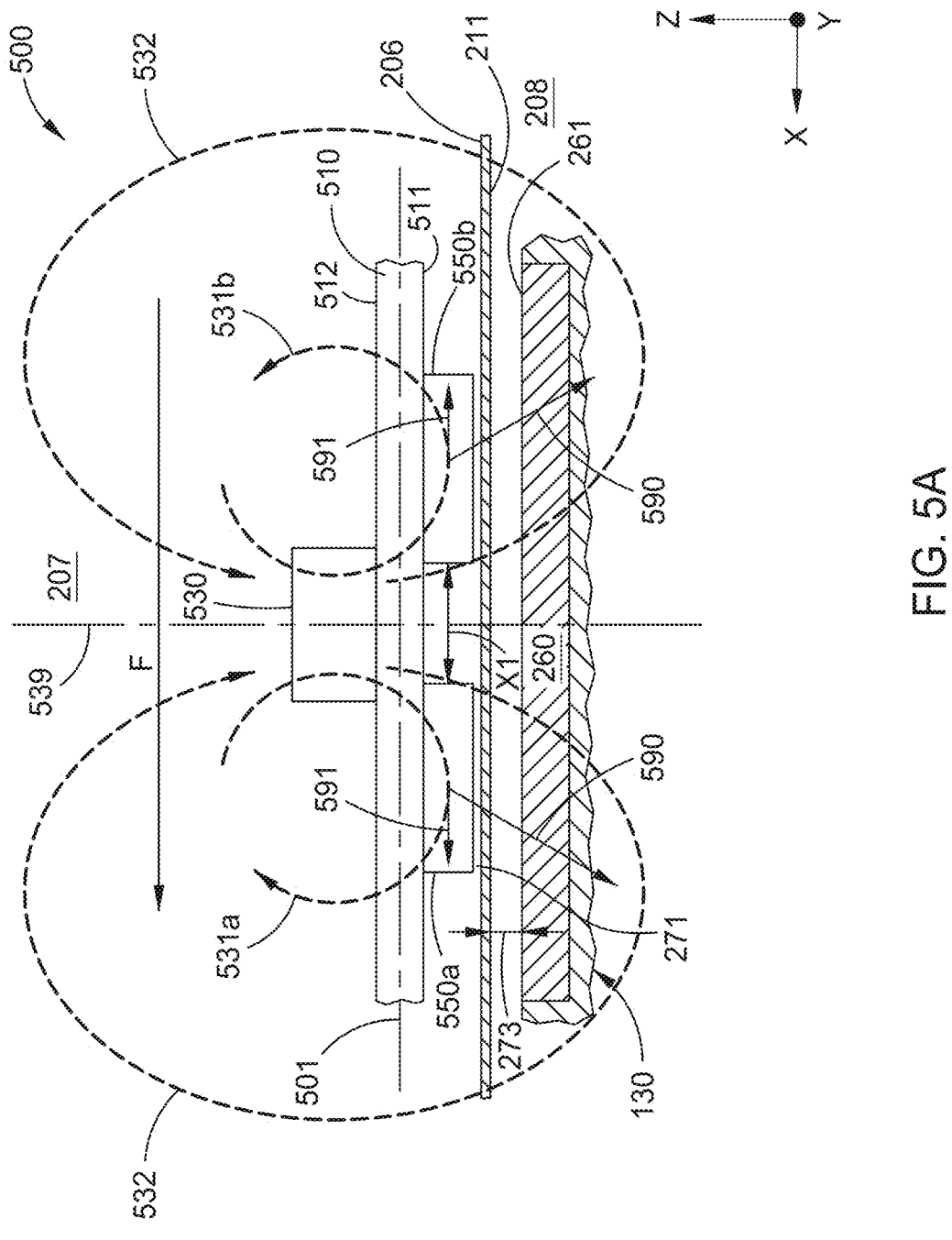

FIG. 5A illustrates a partial cross-sectional view of a portion of an example station showing an exemplary magnetic sensor, in accordance with embodiments of the present disclosure.

Figure 5B:
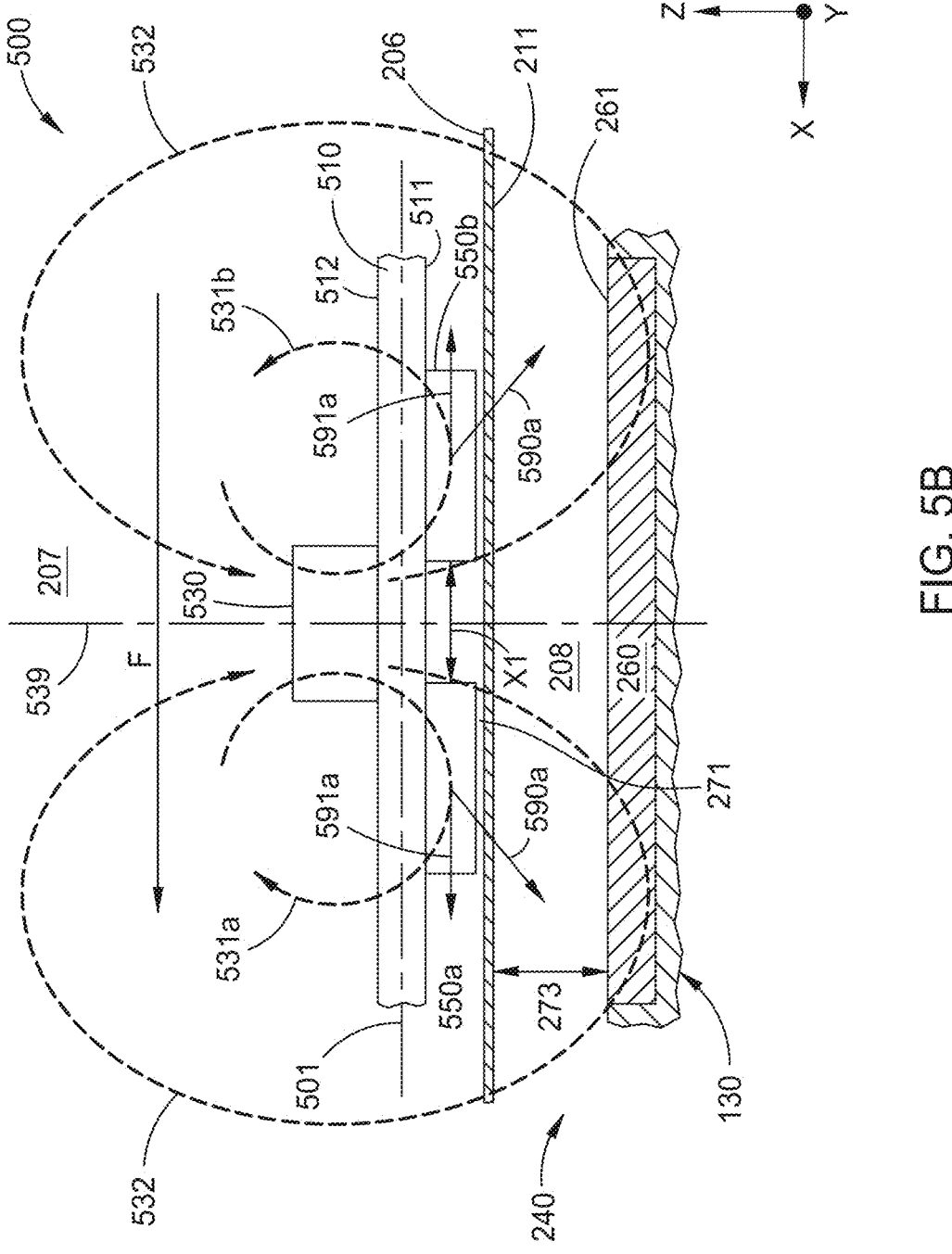

FIG. 5B illustrates a partial cross-sectional view of a portion of an example station showing an exemplary magnetic sensor, in accordance with embodiments of the present disclosure.

Figure 6A:
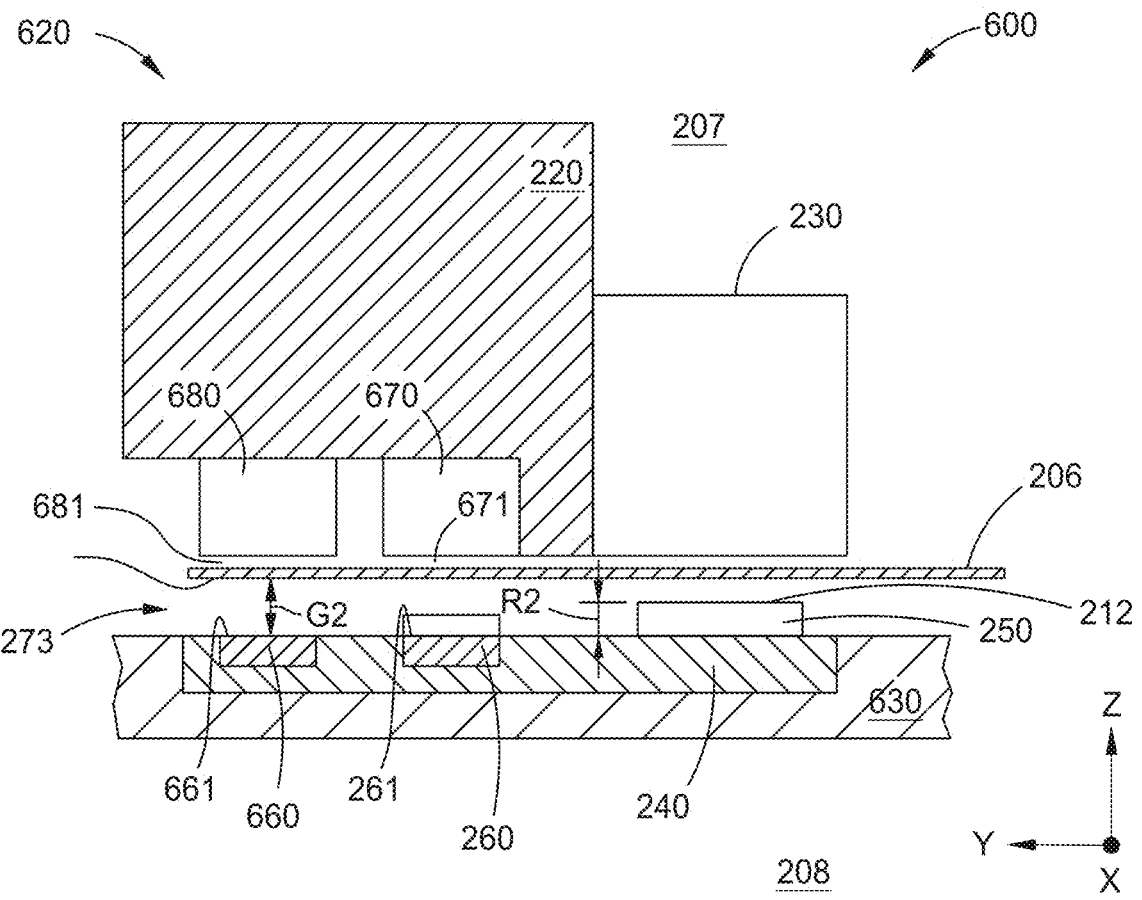

FIG. 6A illustrates a schematic partial cross-sectional view of a portion of a process station, in accordance with embodiments of the present disclosure.

Figure 6B:
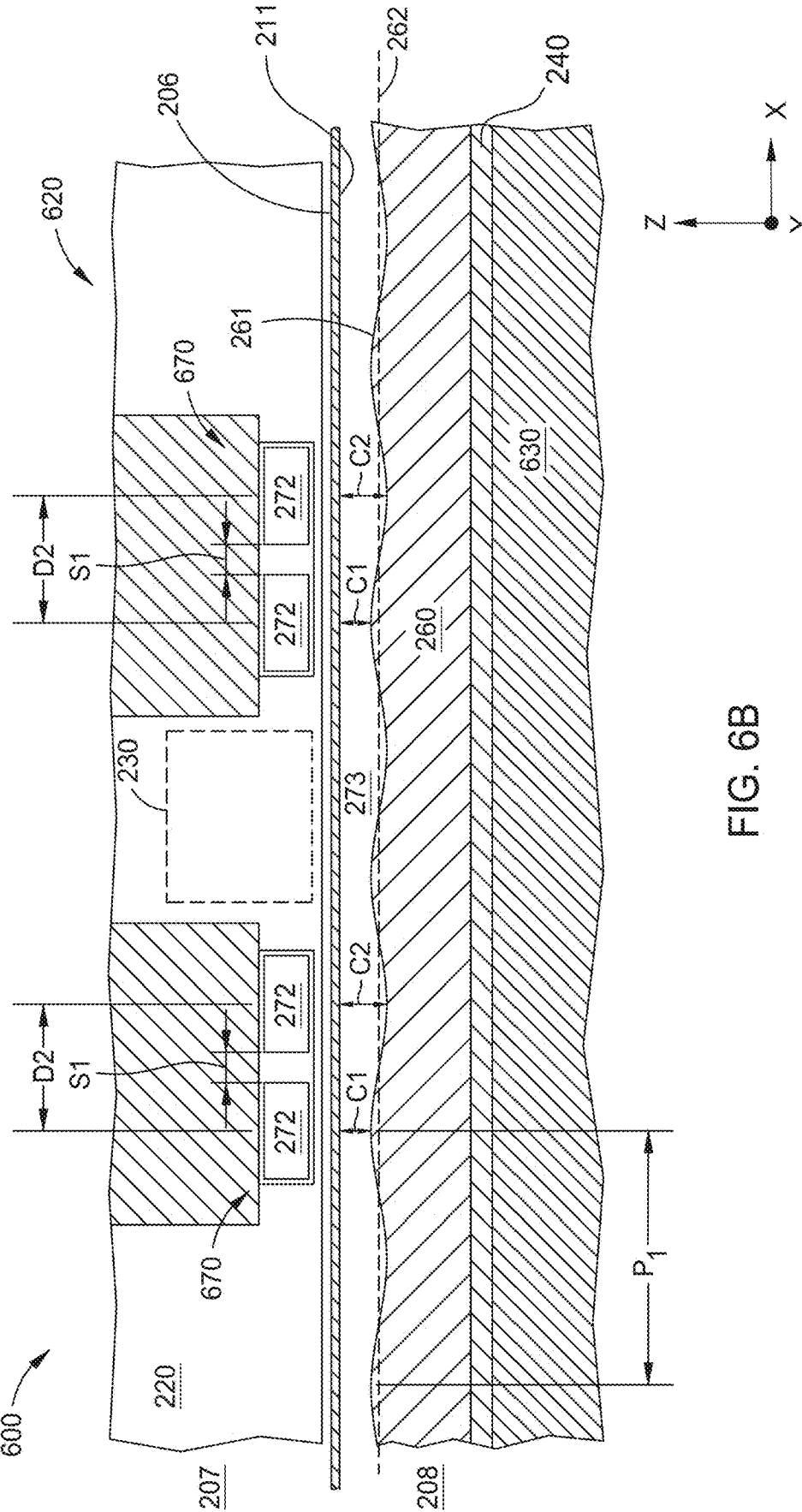

FIG. 6B is a schematic side view of the portion shown in FIG. 6A, in accordance with embodiments of the present disclosure.

Figure 6C:
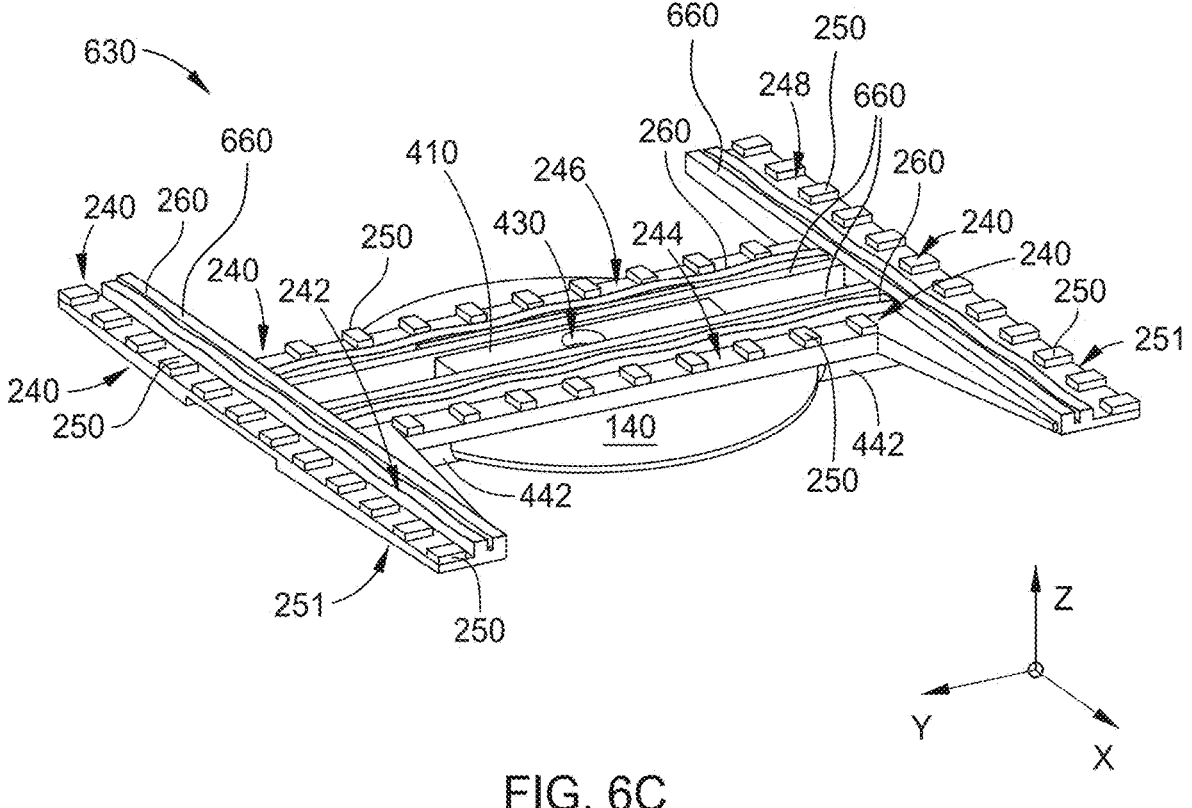

FIG. 6C illustrates an example carrier that includes a base and magnetic levitation elements that may be disposed in the process station shown in FIGS. 6A and 6B, in accordance with embodiments of the present disclosure.

Figures 7A, 7B:
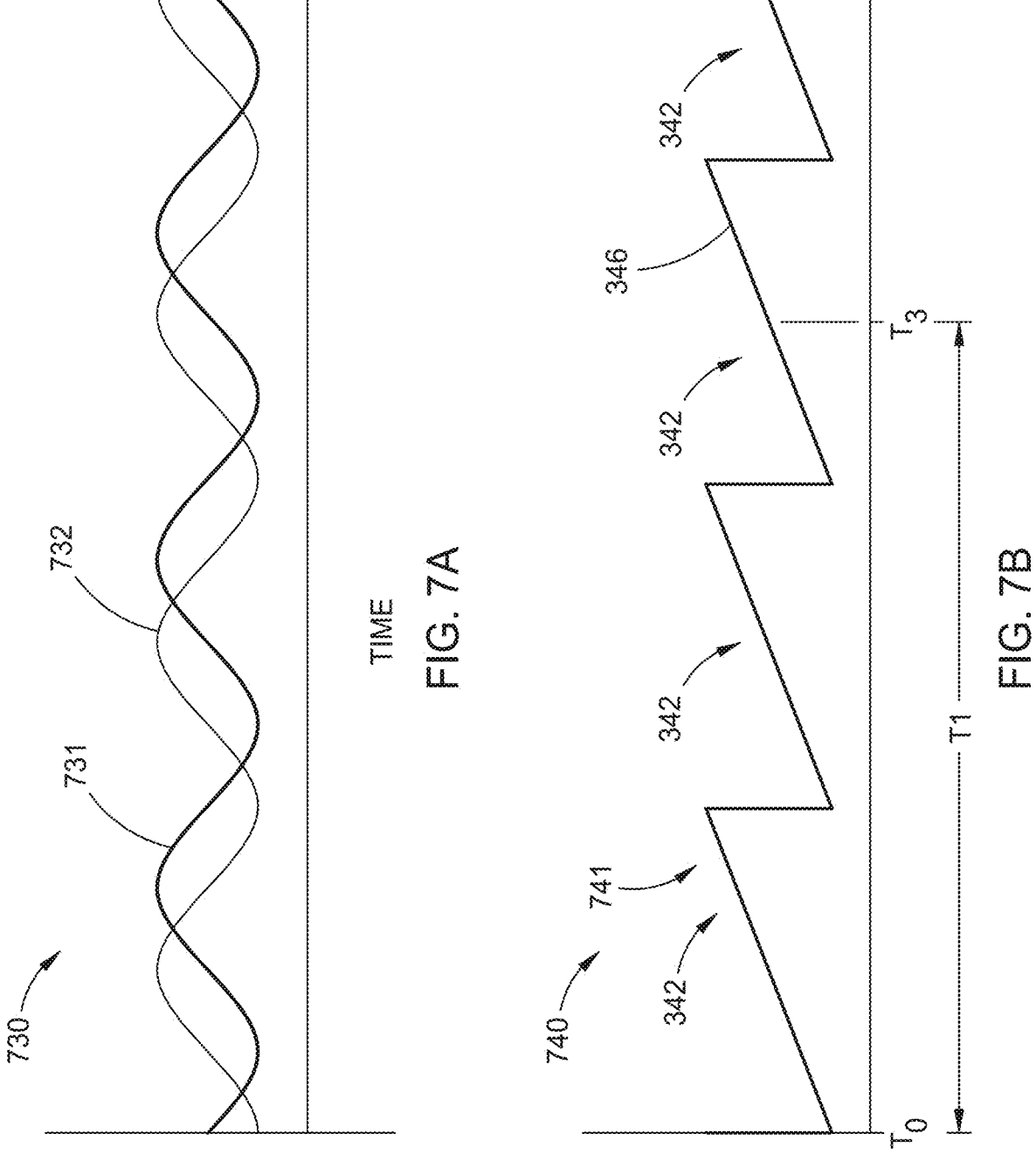

FIG. 7A illustrates an exemplary graph showing voltage outputs of two sensors of a first magnetic sensor assembly over time, in accordance with embodiments of the present disclosure.

FIG. 7B illustrates an exemplary graph showing a sawtooth signal generated by inputting the voltage signals shown in FIG. 7A into a sine-cosine decoder, in accordance with embodiments of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to magnetic sensors that are compatible with substrate transfer systems, including the use of one or more magnetic sensors to detect the position of a carrier configured to support and transfer objects, such as semiconductor substrates. The carrier has a sinusoidal element including a sinusoidal profile. A membrane is disposed between the carrier and the one or more magnetic sensors. In some embodiments, one or more magnetic sensor assemblies including at least three magnetic sensors detect a vertical position and a horizontal position of the carrier through the membrane using the sinusoidal element of the carrier.

In some embodiments, the carrier has both the sinusoidal element and a featureless element with a planar surface. One or more first sensor assemblies including at least two magnetic sensors detect a horizontal position of the carrier through the membrane using the sinusoidal profile of the sinusoidal element. One or more second sensor assemblies including at least one magnetic sensor detects the vertical position of the carrier through the membrane using the featureless element.

FIG. 1 illustrates a top schematic view of an example substrate processing system 100, in which embodiments of the present disclosure may be implemented. The substrate processing system 100 includes a controller 150 and one or more processing lines 102.

The one or more processing lines 102 each include a plurality of stations, as illustrated in FIG. 1. In one example, the processing line 102 illustrated on the right side of FIG. 1 includes at least four process stations 112, 113, 116, and 117, the processing line 102 illustrated on the left side of FIG. 1 includes at least four process stations 112, 113, 116, and 117. However, process stations 111, 114, and 115 may also be configured to perform one or more substrate processing processes. Each processing line 102 may include a magnetic transportation system (not shown) that includes a plurality of individual magnetic levitation assemblies disposed within the stations 111-118 that are configured to convey an object 140 (FIG. 4) disposed on one or more support surfaces of a carrier 130 (FIGS. 2A-2B and exemplary carrier 400 shown in FIG. 4) through the processing line 102. Each processing line 102 may be independent of other processing lines 102. The processing lines 102 may be physically separated by one another by a gap 103. The gap 103 may be sized such that a technician may walk between each processing line 102 to service the one or more stations 111-118.

Each processing line 102 may include a plurality of slit valves 160 to selectively isolate each station 111-118. The slit valves 160 may be selectively opened and closed to allow a clear path for the travel of the carrier 130, to selectively isolate the stations 111-118 from one another, and to facilitate the pressurization or depressurization of the stations 111-118.

The substrate processing system 100 may be used to process multiple substrates in each processing line 102 to produce a desired fabricated substrate. In some cases, the substrate processing system 100 may include a plurality of physical vapor deposition (PVD) processing chambers. For example, the first station 111 may be a first load lock station, the second station 112 may be a degas station, the third station 113 may be a pre-clean station, the fourth station 114 may be a routing station, the fifth station 115 may be a routing station, the sixth station 116 may be a PVD tantalum nitride deposition station, the seventh station 117 may be a PVD copper deposition station, and the eighth station 118 may be a routing station that also serves as a buffer station. An object 140 (e.g., substrate) may be transferred and processed within each process station 112-113 and 116-117. The pressure within each station 111-118 may decrease from station to station. For example, the pressure within the seventh station 117 may be lower than the pressure within the other stations (e.g., stations 111-116 and 118).

The first station 111 (e.g., load lock station) may have a magnetic levitation assembly 120 (shown in FIG. 2A), which includes one or more magnetic levitation actuator assemblies 120A that include a plurality of linear stators 230 (FIG. 2B) and a plurality of sensor assemblies 270. Each magnetic levitation actuator assembly 120A may include the plurality of linear stators 230 arranged in a linear array (e.g., row) and the plurality of sensor assemblies 270 arranged in a linear array adjacent to the linear array of linear stators 230. The carrier 130 is conveyed along the row of linear stators 230. As will be discussed further below, the stations 111-118 each typically include two or more magnetic levitation actuator assemblies 120A that are spaced apart within each of the stations 111-118 to support the carrier 130 as the carrier 130 is transferred through the station. The stations 112-113 and 116-117 (e.g., process stations) may each have a magnetic levitation assembly 120. The fourth station 114, fifth station 115, and eighth station 118 (e.g., routing stations) may each have a magnetic levitation assembly 120. The fifth station 115 may also include a plurality of shutter disks to be placed on a carrier 130 without the object 140. The shutter disks are used to receive deposition material when needed in the place of the object 140 to clean processing equipment, such as cleaning buildup found on a PVD target disposed within the PVD deposition process stations (e.g., stations 116-117).

The magnetic levitation assembly 120 of the first station 111 and the magnetic levitation assembly 120 of the eighth station 118 may cooperate to change the transfer direction (e.g., X-direction to Y-direction) of the carrier 130 within the substrate processing system 100. Additionally, the magnetic levitation assembly 120 of the fourth station 114 and the magnetic levitation assembly 120 of the fifth station 115 may cooperate to change the transfer direction of travel of the carrier 130.

FIGS. 1, 2A, 2B, 2C, 2D, and 3-7 include an X-Y-Z coordinate system to illustrate the transfer directions of the carrier 130 and object 140 through the substrate processing system 100, as well as the orientation of the carrier (e.g., carrier 130, 400). The arrows illustrate the direction that one or more carriers 130 circulate within the processing line 102. During an example processing operation, the carrier 130 receives an object 140 (see FIG. 4) entering the first station 111 in the X-direction from one or more front opening unified pods (FOUPS) 126 of a factory interface 124. The carrier 130 is then conveyed to the second station 112 in the X-direction. The first station 111 also receives the carrier 130 from the eighth station 118 in the Y-direction. After the carrier 130 is conveyed into the second station 112, the carrier 130 is conveyed to the fourth station 114 through the third station 113 in the X-direction. The carrier 130 is then conveyed from the fourth station 114 to the fifth station 115 in the Y-direction. The carrier 130 is then conveyed from the fifth station 115 to the eighth station 118 in the negative X-direction through the stations 116-117. The carrier 130 is then conveyed in the Y-direction back into the first station 111. The now fabricated object 140 is transferred back to the FOUP 126. Another object 140 may then be placed onto the carrier 130 in the first station 111 for another processing operation. A shutter disk may be conveyed on a carrier 130 from the fifth station 115 to the first station 111 in a similar manner as the object 140.

In some embodiments of the substrate processing system 100, the processing line 102 has a non-deposition portion 133 and a deposition portion 134. The non-deposition portion 133 may include a linear arrangement of stations, such as the first station 111, the second station 112, the third station 113, and the fourth station 114, that do not subject the object 140 to a process that deposits a layer on the object 140. After the object 140 passes through the non-deposition portion 133, the object 140 is conveyed into the deposition portion 134 that may be a linear arrangement of stations, such as the fifth station 115, the sixth station 116, the seventh station 117, and the eight station 118, that includes at least one station that deposits at least one layer on the object. For example, the non-deposition portion 133 includes the first station 111 that is a first load lock, the second station 112 that is a degas station, the third station 113 that is a pre-clean station, and the fourth station 114 that is a routing station. The deposition portion 134 includes the fifth station 115 that is a routing station, the sixth station 116 that is a tantalum nitride deposition station, the seventh station 117 that is a copper deposition station, and the eighth station 118 that is a routing station that also serves as a buffer station.

FIG. 2A and FIG. 2B each illustrate side views of a portion 200 of an example process station (e.g., stations 112-113 and 116-117) of the substrate processing system 100 of FIG. 1, in which embodiments of the present disclosure may be implemented. The example process station, which may be the process station 112-113, 116-117 described above, may be referred to herein as simply the process station 205 for clarity. The process station 205 may be configured for contactless transportation of the carrier 130. The process station 205 may include a process chamber 201 that is maintained at a vacuum pressure, such that a processing region 204 of the process chamber 201 is at a pressure that is less than 760 Torr, or even at a pressure between 1 milliTorr (mTorr) and 500 Torr. The process station 205 may be configured for contactless transportation of the carrier 130 in a vacuum chamber (see second region 208) disposed below the processing chamber.

The process station 205 includes a membrane 206 (FIGS. 2B-2D) disposed between the carrier 130 and the magnetic levitation assembly 120. The pressure may be different on opposing sides of the membrane 206. For example, the membrane 206 may be a barrier that isolates a first region 207 of the process station 205 that includes the magnetic levitation assembly 120 from a second region 208 (e.g., vacuum chamber, transport region) where the carrier 130 is located. The first region 207 may be at atmospheric pressure while the second region 208 may be at a vacuum pressure.

The membrane 206 may be made from a material selected from a material comprising transition metals (e.g., iron, nickel, cobalt) and their alloys, and alloys of rare-earth metals. In some embodiments, the membrane 206 is formed from a non-ferromagnetic material, such as some found in metallic and ceramic materials. In one example, the membrane 206 may be formed from a stainless steel, such as a non-ferromagnetic stainless steel (e.g., 301, T304, 304, 316). In some embodiments, the membrane is formed from a titanium alloy. In another example, the membrane is formed from a ceramic material, such as, e.g., alumina, quartz, zirconia, etc. Thus, the membrane 206 may be made of a non-transparent material, in some embodiments, that blocks the line of sight between the sensor assemblies 270 and the carrier 130.

The carrier 130 may be configured to carry one or more objects 140 (See FIG. 4). For example, the carrier 130 may be a substrate carrier, a shutter disk carrier or a mask carrier. The carrier 130 may also be configured to transport process kit component parts. The carrier 130 may be transported in the X-direction or negative X-direction, as illustrated in FIG. 2A. The carrier 130 may also be transported in the Y-direction or negative Y-direction, as described above.

The carrier 130 includes one or more a magnetic levitation elements 240 that allow the carrier 130 to be levitated and transported through the process station 205. The magnetic levitation element 240 may be a track in the X-direction or the Y-direction. The magnetic levitation element 240 may be a substantially straight magnetic levitation element 240, or may at least include one or more straight portions that allow the carrier 130 to be contactlessly transported through the substrate processing system 100. The magnetic levitation element 240 may define a transportation direction (or transport direction), along which the carrier 130 is contactlessly transported. In one example, as illustrated in FIG. 2A, the carrier 130, which includes one or more magnetic levitation elements 240, is transferred through the process station 205, and to and from other adjacent process stations 205 (not shown), by magnetic levitation, without the carrier 130 contacting the walls or components within the process station 205.

As illustrated in FIG. 2A, the process station 205 includes a magnetic levitation assembly 120 that includes a plurality of magnetic levitation actuator assemblies 120A. The magnetic levitation actuator assemblies 120A interact with a corresponding magnetic levitation element 240 through the membrane 206. The magnetic levitation actuator assemblies 120A each include a plurality of linear stators 230. For example, a magnetic levitation actuator assembly 120A may include two or more, three or more, five or more, or 10 or more linear stators 230, depending on the desired length of the magnetic levitation elements 240, which is often referred to herein as a magnetic levitation element 240. Alternatively, the magnetic levitation actuator assemblies 120A of the magnetic levitation assembly 120 may include one elongated linear stator 230 extending along the entire length of a magnetic levitation element 240. The number of linear stators 230 shown in FIGS. 2A and 2B are examples, and a greater or lesser number of linear stators 230 may be used.

The linear stator 230 may be arranged to guide a corresponding magnetic levitation element 240 of the carrier 130 underneath. For example, a plurality of linear stators 230 may be disposed one after the other in a row, such as shown in FIG. 2A, extending in the X and/or Y-direction. In some embodiments, the one or more linear stators 230 are configured to remain stationary during contactless transportation of the carrier 130 along the magnetic levitation element 240 since the one or more linear stators 230 are coupled to a wall (e.g., top wall or side wall) of the process station 205.

The one or more linear stators 230 may include a plurality of stator poles 232, such as 2, 3, 4, 5, 6, 7, 8 or more stator poles 232, as illustrated in FIG. 2B. The number of stator poles 232 shown in FIGS. 2A and 2B are examples, and a greater or lesser number of stator poles 232 may be used. The stator poles 232 may be protrusions, or teeth, that may project towards the carrier 130 and/or towards a magnetic levitation element 240 attached to the carrier 130. The plurality of stator poles 232 may define at least one comb structure. In some embodiments, a linear stator 230 may include two comb structures, each having a plurality of stator poles 232.

The magnetic levitation assembly 120, which includes the one or more linear stators 230, and the stator poles 232, may include, or be made of, a magnetic material, more specifically a ferromagnetic material. The magnetic material may be a non-permanent, or soft, magnetic material. The magnetic material may be a metal, such as electrical steel, silicon steel, ferritic steel, martensitic steel, or any other soft magnetic material.

The magnetic levitation element(s) 240 of the carrier 130 may include, or be made of, a magnetic material, such as a ferromagnetic material. The magnetic material may be a non-permanent, or soft, magnetic material. The magnetic material may be a metal, such as electrical steel, silicon steel, ferritic steel, martensitic steel, or any other soft magnetic material.

In some embodiments, as shown in FIG. 2A, the carrier 130 may be levitated and contactlessly transported in the X or Y-direction through the substrate processing system 100, for example when the carrier 130 is a substrate carrier for a large area substrate or a mask carrier carrying a mask for a large area substrate. The magnetic levitation element 240 is coupled to a portion of the top of the carrier 130, as illustrated. The magnetic levitation assembly 120, or at least a portion thereof, may be disposed above the carrier 130.

The carrier 130 is configured to be levitated and transported along the length of the magnetic levitation assembly 120 by use of the one or more linear stators 230 of the magnetic levitation assembly 120 that remain stationary within the process station 205. During contactless levitation and/or transportation of the carrier 130, the magnetic levitation element 240 faces at least one linear stator 230. The magnetic levitation element 240 may respectively face different linear stators 230 as the carrier 130 is transported along the magnetic levitation element 240.

As shown in FIGS. 2B-2C and FIG. 4, the magnetic levitation element 240 may include an array of features 250. Any number of features 250 may be formed within an array of features 250. The features 250 may be protrusions, or teeth, that may project towards at least one linear stator 230 of the opposing magnetic levitation actuator assembly 120A. The raised segments of features 250, which include a magnetic material, may define a comb-like structure as illustrated in FIG. 2B and FIG. 4. Each magnetic levitation element 240 may also include a sinusoidal element 260 adjacent to each array of features 250. The sinusoidal element 260 may span the same or part of the length of the array of features 250. The upper surface 261 of the sinusoidal element 260 has a sinusoidal profile. The sensor assemblies 270 use the sinusoidal element 260 to measure and/or or detect a position of the carrier 130 during contactless levitation and/or transportation. In some embodiments, the sinusoidal element 260 is formed from a ferrous material, such as being a strip of a ferromagnetic material embedded in or attached to the carrier 130. For example, the sinusoidal element 260 may be made of magnetic stainless steel.

In some embodiments, the magnetic levitation element 240 does not include a sinusoidal element 260. The sinusoidal element 260 is disposed adjacent to and running parallel to the features 250 of the magnetic levitation element 240.

A pitch, or spacing, may be provided between adjacent stator poles 232 of a linear stator 230. The term "adjacent stator poles" (and likewise "adjacent features 250") refers to poles of a same linear stator 230 that are adjacent to each other with respect to the direction defined by the magnetic levitation element 240, such as the transportation direction (e.g., X-direction in FIG. 2A). The pitch may be a distance, e.g. a horizontal distance, extending along the magnetic levitation element 240. Likewise, a pitch or spacing may be provided between adjacent features 250 of the magnetic levitation element 240. According to some embodiments, a first pitch between adjacent stator poles 232 of a linear stator 230 may be different from a second pitch between adjacent features 250 of the magnetic levitation element 240. Particularly, a ratio of the first pitch and the second pitch may be non-integer (the first pitch is not an integer multiple of the second pitch and the second pitch is not an integer multiple of the first pitch). The stator poles 232 of the linear stator 230 and the features 250 of the magnetic levitation element 240 may be provided according to a p/q configuration. A p/q configuration means that the distance (in the transportation direction) spanned by p consecutive adjacent stator poles 232 of the linear stator 230 includes a total of q features 250 of the magnetic levitation element 240. In some embodiments, q may be equal to p+1 or to p−1. For example, it may be the case that p=3 and q=2; or p=3 and q=4. In further examples, it may be the case that p=4 and q=3.

According to some embodiments, the one or more linear stators 230 of the magnetic levitation assembly 120 include a set of electromagnets. In light thereof, the one or more linear stators 230 are active magnetic systems that can provide an adjustable, controllable magnetic field. For example, each stator pole 232 of the linear stator 230 may include an electromagnet. The electromagnet may include a respective coil wound around each stator pole 232. Different winding schemes for winding the coils around each stator pole 232 may be provided. For example, the coils may be wound vertically, in that the coils are wound from top to bottom (clockwise) or from bottom to top (counter-clockwise). In some embodiments, the magnetic levitation element 240 may not include an electromagnet. The magnetic levitation element 240 may be a magnetically passive system, wherein the magnetic levitation element 240 is formed from a ferromagnetic material (e.g., permanent magnet, soft ferromagnetic iron), without any electromagnets mounted thereon. In some embodiments, the magnetic levitation element 240, or at least the features 250 formed thereon, include a ferromagnetic material such as a material selected from a group comprising transition metals (e.g., iron, nickel, cobalt) and their alloys, and alloys of rare-earth metals. In one example, the magnetic levitation element 240 includes a ferritic stainless steel, such as a 409, 430 and 439 stainless steel. The magnetic levitation element 240 may also include an electrical steel, silicon steel, martensitic steel, or any other soft magnetic material.

In some embodiments, the magnetic levitation assembly 120 includes two parallel magnetic levitation actuator assemblies 120A running in the X-direction configured to levitate carrier 130 and convey the carrier 130 in either the positive or negative X-direction. The carrier 130 similarly includes two parallel magnetic levitation elements 240 running in the X-direction. Each magnetic levitation element 240 is positioned on the carrier 130 to be underneath the one or more linear stators 230 of a respective magnetic levitation actuator assembly 120A running in the X-direction when the carrier is being conveyed in the X-direction. Additionally, the magnetic levitation assembly 120 may also include two parallel magnetic levitation actuator assemblies 120A running in the Y-direction configured to levitate the carrier 130 and convey the carrier 130 in either the positive or negative Y-direction. The carrier 130 similarly includes two parallel magnetic levitation elements 240 running in the Y-direction. Each magnetic levitation element 240 is positioned on the carrier 130 to be underneath the one or more linear stators 230 of a respective magnetic levitation actuator assembly 120A running in the Y-direction when the carrier 130 is being conveyed in the Y-direction. As the carrier 130 moves in the Y-direction, the magnetic levitation elements 240 running in X-direction move out of alignment with the corresponding magnetic levitation actuator assemblies 120A running in the X-direction. The magnetic levitation actuator assemblies 120A running in the Y-direction are able to maintain levitation as the carrier 130 is moved in the Y-direction. The carrier 130 may be conveyed in the Y-direction to another station (e.g., from the fourth station 114 to the fifth station 115) until the magnetic levitation elements 240 running in the X-direction become aligned with corresponding magnetic levitation actuator assemblies 120A running in the X-direction where the carrier 130 may then be conveyed again in the X-direction.

The process station 205 may include the controller 150. In some embodiments, each process station 205 has its own controller 150 that is connected to a central controller of the substrate processing system 100. The controller 150 may be connected to the set of electromagnets of the linear stators 230 for controlling a current in the electromagnets, and thus the strength of the magnetic field generated by linear stators 230. The current can be increased to increase the attraction force of the set of electromagnets to raise the carrier 130 or decreased to lessen the attraction force of the set of the electromagnets to lower the carrier 130.

The controller 150 as described herein may be a single centralized controller or may be a distributed controller including a plurality of individual control units. The controller 150 may include a central processing unit (CPU), a memory and, for example, support circuits. To facilitate control of the carrier 130, the CPU may be one of any form of general-purpose computer processor that can be used in an industrial setting for controlling various components and sub-processors. The memory may be coupled to the CPU. The memory, or a computer readable medium, may be one or more readily available memory devices such as random-access memory, read only memory, a floppy disk, a hard disk, or any other form of digital storage either local or remote. The support circuits may be coupled to the CPU for supporting the processor in a conventional manner. The circuits in question include cache, power supplies, clock circuits, input/output circuitry and related subsystems, and the like. Software instructions and data can be coded and stored within the memory (e.g., non-transitory computer readable medium) for instructing the CPU. A program (or computer instructions) readable by the processing unit within the system controller determines which tasks are performable in the processing system. For example, the non-transitory computer readable medium includes a program which when executed by the processing unit are configured to perform one or more of the methods described herein. Preferably, the program includes code to perform tasks relating to monitoring, execution and control of the movement, support, and/or positioning of a substrate along with the various process recipe tasks and various processing module process recipe steps being performed within the system.

The one or more linear stators 230 including the electromagnets may, together with the magnetic levitation element 240, form a linear reluctance motor for providing both a contactless levitation and a contactless drive of the carrier 130. A linear reluctance motor is configured for providing a linear motion, or translational motion, of the carrier 130. A linear motor is distinguished from a rotary motor, which provides a rotational motion. The linear reluctance motor of the apparatus according to embodiments described herein provides a linear motion of the carrier 130 along the magnetic levitation assembly 120.

As shown in FIGS. 2B-2D, the process station 205 may include one or more sensor assemblies 270 that are used to determine both a vertical position (e.g., position along Z-direction) and a horizontal position (e.g., position along the X-direction) of the carrier 130 during contactless levitation and/or transportation. In some embodiments, the sensor assemblies 270 are included in the magnetic levitation assemblies 120. In some embodiments, a plurality of sensor assemblies 270 are arranged in a linear array (e.g., row) adjacent to the linear array of linear stators 230, such as shown in FIG. 2B. For example, sensor assemblies 270 may be provided on opposite ends of each linear stator 230. Each sensor assembly 270 is configured to detect a sinusoidal element 260 of the carrier 130. Each sensor assembly 270 can be used to detect a position of the carrier 130 based on the sinusoidal element 260. For example, the sensor assembly 270 may be used to determine both a vertical position and a horizontal position of the carrier 130, the vertical position being the position of the carrier 130 along the Z-direction and the horizontal position being a position along the transportation direction.

The controller 150 may be configured to control the reluctance-based drive force generated by the stators 230 to position the carrier 130 in a target position within the second region 208 in response to a position detected by the one or more sensor assemblies 270. The target position may be a target vertical position and/or target position in the transportation direction. The reluctance-based drive force may be configured to align the carrier 130 along the magnetic levitation element 240 or transport direction. By controlling amplitude and phase angle of an AC signal provided to the coils coupled to the stator poles 232, the dynamic motion characteristics of the magnetic levitation elements 240 and thus the carrier 130, such as the amount of jerk, acceleration, velocity, and finally horizontal position can be adjusted and achieved. The controller 150 may cause the magnetic levitation assembly 120 to adjust the roll, pitch, and/or yaw of the carrier 130 if the sensor assemblies 270 detect that the carrier 130 is not level, such as having an unacceptable roll or pitch. The controller 150 may also cause the magnetic levitation assembly 120 to maintain the carrier 130 in a level orientation (see FIG. 2D) as it passes through the second region 208.

The controller 150 may instruct the magnetic levitation assembly 120 to change the vertical position of the carrier 130 based on the sensor assemblies 270, such as raising and lowering to carrier 130 relative to the membrane 206 to adjust or maintain a gap (see median gap G1 in FIGS. 2C and 2D) between the carrier 130 and the membrane 206. For example, the controller 150 may reduce the electrical current to the set of electromagnets of the linear stators 230 to lower the carrier 130 in the Z-direction and may increase the current to the set of electromagnets of the linear stators 230 to raise the carrier 130 in the Z-direction. In some embodiments, the carrier 130 is maintained at a desired position in the Z-direction, such as maintaining the carrier 130 in a level orientation, by adjusting the current to the linear stators 230 in responses to changes in position of the carrier 130 detected by the sensor assemblies 270.

FIG. 2C illustrates a schematic partial cross-sectional view of the portion 200 to illustrate the magnetic levitation actuator assembly 120a and carrier 130. A sensor assembly 270 and stator 230 are shown adjacent one another in the Y-direction. The sensor assembly 270 and stator 230 are each attached to a frame member 220 of the magnetic levitation actuator assembly 120a. The frame member 220 may extend along the x-direction above the membrane 206. A plurality of stators 230 may be attached to the frame member 220 arranged in a linear array (e.g., row) that is parallel to a linear array of sensor assemblies 270 attached to the frame member 220. The frame member 220 may be attached to a wall of the process station 205 in the first region 207 to maintain a fixed distance between the top side of the membrane 206 and the sensor assemblies 270 and stators 230. In some embodiments, each sensor assembly 270 is positioned over the membrane 206 or in a recess formed in the membrane 206 such that the sensor assembly 270 is not in contact with the membrane 206. In other words, a clearance 271 may be present between the membrane 206 and the sensor assembly 270.

The stator 230 is shown in FIG. 2C directly above the one or more features 250 of the magnetic levitation element 240 that are located on the other side of the membrane 206. The sensor assembly 270 is positioned adjacent to the stator 230 and is directly above the upper surface 261 of sinusoidal element 260. The sensor assembly 270 uses the sinusoidal profile of the sinusoidal element 260 to determine a vertical position and horizontal position of the carrier 130 within the second region 208.

FIG. 2D is a schematic side view of the portion 200 that illustrates sensor assemblies 270 on opposing sides of a stator 230 positioned in the first region 207 above a portion of the carrier 130 that is disposed in the second region 208. The sensor assemblies 270 are positioned above the sinusoidal element 260. FIG. 2D also shows a cross-section of the sinusoidal element 260 that shows the sinusoidal profile formed by the upper surface 261. A space 273 (e.g., gap) is present between the upper surface 261 of the sinusoidal element 260 and the underside 211 of the membrane 206. The space 273 is also shown in FIG. 2C. The size of the space 273 present between the upper surface 261 and the underside 211 varies across the length of the sinusoidal element 260 due to the periodic nature of the sinusoidal profile.

FIG. 2D shows the sinusoidal profile as a sine wave formed by the upper surface 261. A midline 262 is shown through the middle of the sinusoidal profile. The sinusoidal profile has amplitude between a peak of the wave and the midline 262. The sinusoidal profile also has a period P1. The period P1 extends 360 degrees along the sinusoidal profile. The period P1 extends across a length of the sinusoidal element 260. For example, the period P1 may extend 80 mm of the length of the sinusoidal element 260. Thus, each degree along the period P1 may extend about 0.22 mm. In some embodiments, the period P1 may extend more than or less than 80 mm, such as 100 mm, such as 90 mm, such as 70 mm, such as 60 mm, such as 50 mm, such as 40 mm, such as 30 mm, such as 20 mm, such as 10 mm.

The median gap G1 is shown in FIG. 2C and FIG. 2D as the distance between the underside 211 of the membrane 206 and the midline 262. In other words, the median gap G1 is the median distance between the underside 211 of the membrane 206 and the upper surface 261 of the sinusoidal element 260. The sensor assembly 270, which is positioned a fixed distance from the membrane 206, is able to determine the size of the median gap G1 through the membrane 206 to determine the vertical position (e.g., position in the Z-direction) of the carrier 130 underneath the sensor assembly 270.

Each sensor assembly 270 includes three magnetic field detection sensors 272 to detect changes in the size of the space 273 between upper surface 261 and the underside 211 as the sinusoidal element 260 moves within the second region 208. The sensor assemblies 270 and/or controller 150 use the information obtained from the three sensors 272 to determine the size of the median gap G1 and thus the vertical position of the carrier 130. The sensor assemblies 270 and/or controller 150 also use the information obtained from the three sensors 272 to determine the horizontal position of the carrier 130 along the transportation direction.

As shown in FIG. 2D, the three sensors 272 of each sensor assembly 270 are arranged in a linear array that is parallel to the linear array of stators 230. The sensors 272 in each sensor assembly 270 are spaced apart by a distance D1 (e.g., spacing distance) to sense the size of the space 273 between the underside 211 and a different part of the upper surface 261 of the sinusoidal element 260. In other words, each sensor 272 is positioned to detect a size of the space 273 (e.g., distance between upper surface 261 and underside 211) at different points along the upper surface 261.

FIG. 2D shows a first distance A1, a second distance A2, and a third distance A3. Each of the first distance A1, second distance A2, and third distance A3 represent a different size of the space 273 underneath each sensor 272 between the underside 211 and a point along the upper surface 261. Each of the first distance A1, second distance A2, and third distance A3 are separated by the spacing distance D1 due to the positioning of the three sensors 272. In other words, the three sensors 272 are spaced apart by distance D1 such that each sensor 272 is disposed over a different point along the upper surface 261, each of those points along the upper surface 261 similarly being spaced apart by distance D1. In some embodiments, spacing distance D1 is equivalent to 120 degrees along the sinusoidal profile of the sinusoidal element 260. For example, spacing distance D1 may be 26.67 mm, which is equivalent to 120 degrees along a period P1 that extends along a length of 80 mm. Thus, the spacing distance D1 of the sensors 272 is the desired distance between points along the upper surface 261 rather than a distance between sides of the sensors 272 shown as S1.

Each sensor 272 of the sensor assembly 270 may be connected to the controller 150. The sensors 272 may each be a high-precision sensor, which has a sensor resolution of 100 μm or less, particularly 10 μm or less, that is used to detect the relative position of a portion of the upper surface 261 of the sinusoidal element 260 of the carrier 130 to the sensor assembly 270. Accordingly, the carrier 130 may be positioned vertically and/or horizontally in a target position with high precision.

In some embodiments, each magnetic field detection sensor 272 may have one or more magnets and one or more magnetic field sensor elements. The one or more magnets of the sensor 272 may be permanent magnets or electromagnets. The one or more magnetic field sensor elements are used to detect the magnetic flux density of a magnetic field generated by the one or more magnets in the sensor 272 to determine the size of the space 273. The one or more magnets of the sensor 272 generate a magnetic field that extends through the membrane 206 and into the second region 208. The movement of the sinusoidal element 260 relative to the membrane 206 changes the size of the space 273 underneath each sensor 272. The magnetic field of the one or more magnets of each sensor 272 is modulated due to the changing size of the space 273 caused by the movement of the sinusoidal element 260. The one or more sensor elements of each sensor 272 detects changes in the magnetic flux density as the magnetic field is modulated by the movement of the sinusoidal element 260. The configuration of the one or more magnets and relative position of the magnetic field sensor elements to the magnets in the sensor 272 affects whether increasing the size of the space 273 increases or decreases the magnetic flux density measured by the magnetic field sensor elements.

The one or more magnetic field sensor elements of sensors 272 may measure one or more components of a magnetic flux density vector, such as the x-component of the magnetic flux density vector, to determine the size of the space 273. For example, the magnetic field sensor elements may measure the x-component of the magnetic flux density vector to determine the size of the space 273. Each sensor 272 outputs a signal, such as a voltage signal, based on the detected magnetic flux density associated with the size of the space 273 underneath the sensor 272. The magnetic field sensor element may be a Hall Effect element, a giant magnetoresistance (GMR) element, a tunnel magnetoresistance (TMR) element, or other suitable magnetic field sensor element. It has been found that GMR and/or TMR sensors produce a signal with less noise and are more sensitive than a Hall Effect sensor element providing higher Signal-to-Noise-Ratio (SNR). In some embodiments, the sensors 272 may be or may incorporate the magnetic sensor 500 shown in FIGS. 5A and 5B.

The controller 150 is able to analyze the signal output from the three sensors 272 to determine the size of the median gap G1. Additionally, the controller 150 is able to analyze signal output from the three sensors 272 to determine the horizontal position of the carrier 130 along the transportation direction.

Referring to FIG. 2D, the first sensor 272, being the left-most sensor 272 of the sensor assembly 270 on the left-hand side of the stator 230, may output a first signal based on the detected dimension of first distance A1. The second sensor 272, being the middle sensor 272 of the sensor-assembly on the left-hand side of the stator 230, may output a second signal based on the detected dimension of second distance A2. The third sensor 272, being the right-most sensor 272 of the sensor assembly 270 on the left-hand side of the stator 230, may output a third signal based on the detected dimension of third distance A3. The controller 150 analyzes the first signal, second signal, and third signal to determine the size of the median gap G1 underneath the sensor assembly 270 and also to determine a horizontal position of the carrier 130 along the transportation direction. The controller 150 may also analyze the signals output by the three sensors 272 of sensor assembly 270 on the right-hand side of the linear stator 230 to determine the median gap G1 underneath that sensor assembly 270 as well as the horizontal position of the carrier 130.

Referring back to FIG. 2A, the process station 205 includes a substrate support 209 disposed below the processing chamber 201. The processing chamber 201 includes a process kit assembly 202, and a source assembly 203. As shown, the substrate support 209 is disposed below the process kit assembly 202 and source assembly 203. The carrier 130 is shown in a park position, as indicated by the reference sign 208A, within the second region 208. The carrier 130 is moveable to a transfer position 208B (shown in dashed lines and indicated by reference sign 208B) above the substrate support 209.

The substrate support 209 is moveable in the Z-direction within the second region 208 to one or more positions. While the carrier 130 is moving within the process station 205, the substrate support 209 may be positioned in a lower position to allow the carrier 130 to move to through and/or to one or more positions within the second region 208 without contacting the substrate support 209.

The carrier 130 is moved to the transfer position 208B above the substrate support 209 to facilitate the transfer of the object 140 on the carrier 130 to lift pins of the substrate support 209. The carrier 130 is then moved to the park position 208A (e.g., position opposite to the transfer position) after the object 140 is transferred to the lift pins. The carrier 130 is clear from the substrate support 209 when in the park position 208A to allow the substrate support 209 to move vertically from the lower position to a process position with the transferred object 140 disposed thereon.

The substrate support 209 is engaged with the process kit assembly 202 when in the process position. In some embodiments, the process kit assembly 202 includes one or more components to seal against the substrate support 209 when the substrate support 209 is in the process position. For example, the substrate support 209 and process kit assembly 202 may at least partially define the process region 204 within the process station 205 where the substrate 140 is subjected to a process performed by the source assembly 203. The process region 204, which is defined by surfaces of the substrate 140, the substrate support 209, the process kit assembly 202 and the source assembly 203, is isolated from the second region 208 when the substrate support 209 is in the process position. For example, the source assembly 203 may be configured to deposit a layer via a physical vapor deposition (PVD) process onto the substrate 140. Once the process performed by the source assembly 203 is complete, the substrate support 209 is lowered from the process position to a lower position to allow the carrier 130 to return to the transfer position 208B where the substrate 140 is transferred from the lift pins back onto the carrier 130.

The source assembly 202 may be adapted to perform a physical vapor deposition ("PVD"), chemical vapor deposition ("CVD"), plasma enhanced chemical vapor deposition ("PECVD"), atomic layer deposition ("ALD"), plasma enhanced atomic layer deposition ("PEALD"), etch, lithography, ion implantation, ashing, cleaning, thermal process (e.g., rapid thermal processing, anneal, cool down, thermal management control) degas, and/or other useful substrate processes.

In some embodiments, the membrane 206 may have an opening allowing the substrate support 209 to be raised upward toward the process chamber 201 into engagement with the processing kit assembly 202. In some embodiments, the process station 205 includes one or more separate membranes 206 for each magnetic levitation actuator assembly 120A. The process chamber 201 may disposed between separate membranes 206.

In some embodiments, the controller 150 may turn-off some or all of the sensor assemblies 270 while the substrate 140 is being processed in the processing region 204. The controller 150 may also power down some or all of the sensor assemblies 270, without fully turning-off the sensors 272, to reduce the strength of the magnetic field generated by the one or more electromagnets of the sensors 272. The sensors 272 are powered down by decreasing the current supplied to the one or more electromagnets used to generate the field detectable by the magnetic field sensor elements from an operating current to reduce the strength of the magnetic field. The current is then increased back to the operating current when desirable to use the sensor assembly 270 to obtain a measurement. In some embodiments, some sensor assemblies 270 are fully turned-off (e.g., the current is stopped) while others are powered down. The stators 230 may also be fully or partially turned-off (e.g., powered down) when the substrate 140 is being processed. For example, the stators 230 may be used to move the carrier 130 to the park position prior to processing the substrate 140 within the processing region 204. Once the carrier 130 is in the park position 208A, the controller 150 operates the stators 230 to land the carrier 130 on the bottom of the processing chamber 205 or on a landing rail assembly disposed in the second region. Once the carrier 130 is landed, the stators 230 are powered down (e.g., current is reduced) to reduce the strength of the magnetic field or fully turned-off to stop the generation of magnetic fields. The process within the processing region 204 may then begin. Turning-off and/or powering down the stators 230 and the sensor assemblies 270 during processing mitigates the impact of the magnetic fields generated by either the stators 230 or the sensor assemblies 270 on the process within the processing region 204.

FIG. 3A illustrates an exemplary graph 310 showing the voltage output of the three sensors 272 of one sensor assembly 270 over time. The voltage output reflects the magnet flux density detected by the one or more sensor elements of the sensor 272 over time due to the changing size of the space 273 underneath each sensor 272 caused by the movement of the sinusoidal element 260. Each sensor 272 outputs a different voltage signal shown as voltage outputs 311, 312, 313 in FIG. 3A. The voltage outputs 311, 312, 313 are sinusoidal due to the sinusoidal profile of the sinusoidal element 260. The voltage outputs 311, 312, and 313 are analyzed to determine the size of the median gap G1 and to determine the horizontal position of the carrier 130 along the transportation direction. As shown, the three voltage outputs 311, 312, 313 are out of phase by 120 degrees due to the spacing (e.g., distance D1) of the sensors 272 in the sensor assembly 270. The first voltage output 311 corresponds to the detected first distance A1, the second voltage output 312 corresponds to the detected second distance A2, and the third voltage output 313 corresponds to the detected third distance A3. In other words, the voltage output signal may be correlated with a dimension of the space underneath each sensor 272 at any point in time.

FIG. 3B illustrates an exemplary graph 320 which shows the size of the median gap G1 over time detected by one sensor assembly 270. To determine the size of the median gap G1, the controller 150 averages the voltage output by each sensor 272 at a point in time. In other words, the voltage output 311, 312, 313 at a point in time are added together and then divided by three. The controller 150 then correlates the average voltage to a dimension of the median gap G1. Line 321 reflects the size of the median gap G1 based on the averaged voltage of the voltage outputs 311, 312, 313 over time.

In some embodiments, the voltage outputs 311, 312, 313 do not have a linear relationship to the dimension of the space 273. In other words, a unit increase in the average voltage does not indicate the same unit increase in the size of the space 273. Therefore, the voltage is linearized prior to averaging the voltage outputs 311, 312, 313, such as by inputting the voltage into a look-up table.

FIG. 3B reflects that the carrier 130 was in a stable vertical position over time as the carrier 130 moved horizontally along the transportation direction. While line 321 in graph 320 reflects a constant size of the median gap G1 over time, it will be appreciated that the median gap G1 may vary over time due to changes the vertical position of the carrier 130. The controller 150 may control the position of the carrier 130 in the Z-direction based on the size of the median gap G1 detected by the sensor assemblies 270. In some embodiments, the controller 150 may adjust the current to one or more linear stators 230 to maintain the size of the median gap G1. For example, the gap median G1 may be maintained at a distance less than 10 mm, such as 9 mm, such as 8 mm, such as 7 mm, such as 6 mm, such as 5 mm, such as 4 mm, such as 3 mm, such as 2 mm, such as 1 mm. In some embodiments, the process station 205 is arranged such that the median gap G1 is in either the X-direction or Y-direction rather than the Z-direction. The sensor assembly 270 may be used to control the size of the median gap G1 in the X-direction and/or Y-direction.

The controller 150 may maintain the size of the median gap G1 by closed loop control. For example, the controller 150 may have a desired distance of the median gap G1 as a stored value, such as a gap distance of 5 mm. The controller 150 may use the sensor assemblies 270 to determine the size of the median gap G1 present between the membrane 206 and the sinusoidal element 260. If the detected size is equal to the stored value, then the controller 150 does not cause the stators 230 to adjust the z-position of the carrier 130. In some embodiments, the controller 150 may increase the current to one or more stators 230 if the gap G1 is greater than the stored value to lift the carrier 130 to adjust the gap G1 to the stored value. Similarly, the controller 150 may decrease the current to one or more stators 230 if the gap G1 is less than the stored value to lower the carrier 130 to adjust the gap G1 to the stored value.

In some embodiments, the controller 150 may also not cause the linear stators 230 to adjust the z-position of the carrier 130 if the detected size is within a threshold range of the stored value. For example, the threshold range may be 1 mm, such as 0.9 mm, such as 0.8 mm, such as 0.7 mm, such as 0.6 mm, such as 0.5 mm, such as 0.4 mm, such as 0.3 mm, such as 0.2 mm, such as 0.1 mm, such a 0 mm. In other words, the controller 150 may not adjust the z-position of the carrier 130 if the detected position is within the threshold range, such as being within plus or minus 0.5 mm of 5 mm as an example. If the controller 150 determines that the detected position is outside of the threshold range, then the controller 150 causes the stators 230 to adjust the z-position of the carrier 130 to return the size of the median gap G1 to the stored value.

Additionally, the size of the median gap G1 detected by each sensor assembly 270 may differ if the carrier 130 is not in a level orientation (e.g., not level). The controller 150 may use the median gap G1 detected by each sensor assembly 270 to adjust the pitch or tilt of the carrier 130 to return the carrier 130 to a level orientation. This process may repeat cyclically during the operation of the process station 205 to maintain the desired size of the median gap G1 and thus z-position of the carrier 130.

The sensors 272 may be calibrated to compensate for differences in the components of the sensor 272 and to compensate for positional differences of the magnetic field sensor elements relative to one another. For example, each sensor element may output different voltages for the same experienced magnetic flux density. For example, one magnetic field sensor element may be closer to the membrane 206 than the other magnetic field sensor element. Thus, the voltage signal output of the one or more sensor elements may be inaccurate. The sensor 272 may be calibrated to account for the inaccuracy in the signal produced by each sensor element. For example, the controller 150 or processor of the sensor 272 may adjust the voltage output of the sensor elements by a factor or offset to correct for the error.

Additionally, the three sensors 272 may vary in position relative to the membrane 206. The output of each sensor 272 may be adjusted by a factor or offset to correct for the variation in the position of the sensors 272.

Referring back to FIGS. 2C and 2D, the underside 211 of the membrane 206 is used as a datum to determine the size of the median gap G1. In some embodiments, the membrane 206, however, may deform (e.g., bow, deflect) due to the pressure differential between the first region 207 and second region 208. The amount that the membrane 206 deforms varies due to differences in the thickness of the membrane 206. In some embodiments, the membrane 206 may be composed of a material that is attracted to the magnetic fields generated by the stators 230 and the magnet(s) in the sensors 272. This attraction force generated by the stators 230 and magnet(s) of the sensors 272 may also cause the membrane 206 to deform. Additionally, the membrane 206 may deform due to thermal expansion and contraction. Thus, the underside 211 of the membrane 206 may not be a uniform flat surface but instead may vary along the length of the membrane 206 that runs in the transportation direction.

In some embodiments, the sensor assemblies 270 are calibrated to compensate for the variations in the position of the underside 211 of the membrane 206. The carrier 130 is periodically raised into engagement with the membrane 206 as the carrier 130 is transported through the second region 208. The controller 150 may use the information obtained by one or more sensor assemblies 270 while the carrier 130 is engaged with the membrane 206 to determine the position of the underside 211 of the membrane 206 to calibrate the sensors 272 of the one or more sensor assemblies 270.

For example, the carrier 130 may be lifted to engage the top surface 212 of the features 250 with the membrane 206. The top surface 212 of the features 250 have a fixed position relative to the carrier 130, such as having a fixed position relative to the sinusoidal element 260. The sensor assemblies 270 then determine the size of the median gap G1 present while the carrier 130 is engaged with the membrane 206. Each sensor assembly 270 may detect a different size of the median gap G1 based on the variation of the deformation of the membrane 206 underneath the specific sensor assembly 270. The detected median gap G1 may then be compared to a first reference gap size R1. The first reference gap size R1 is the size of the median gap G1 that would be present if the underside 211 of the membrane 206 was undeformed.

FIG. 2C shows a cross-section of the sinusoidal element 260 such that a portion of the upper surface 261 that intersects with the midline 262 is underneath the sensor assembly 270. Thus, FIG. 2C shows the median gap G1. FIG. 2C also shows the first reference gap size R1 as the differential between the top surface 212 of the feature 250 and the upper surface 261 of the sinusoidal element 260 that intersects with the midline 262. In some embodiments, the controller 150 uses the differential in the detected median gap size and the first reference gap size R1 to determine the actual position of the underside 211 of the membrane 206 underneath each sensor assembly 270. The controller 150 then calibrates the output of a sensor assembly 270 based on the actual position of the underside 211 of the membrane 206 beneath the sensor assembly 270 to determine the size of the median gap G1. In other words, the controller 150 uses the determined position of the underside 211 of the membrane 206 as the datum for the sensor assembly 270. The sensor assembly 270 may be calibrated by adjusting the voltage output of each sensor 272 by a factor or offset to account for the position of the underside 211 of the membrane 206.

The controller 150 may repeatedly engage the carrier 130 with the membrane 206 to calibrate the sensor assemblies 270 as the carrier 130 moves along the transportation direction. For example, the controller 150 may cause the stators 230 to lift the carrier 130 into engagement with the membrane 206 after the carrier 130 travels a distance in the transportation direction to allow the controller 150 to calibrate the sensor assemblies 270 above the carrier 130. This distance may be equivalent to the length of one stator 230.

In some embodiments, each sensor assembly 270 is calibrated by engaging the carrier 130 with the underside 211 of the membrane 206 to determine the position of each sensor 272, such as the position of each sensor element of the sensor 272, relative to the membrane 206. For example, the carrier 130 may be engaged with the membrane 206 to determine the position of the sensors 272 relative to the underside 211. Engaging the carrier 130 with the membrane 206 allows the controller 150 to determine the variations in position of each sensor 272 in the sensor assembly 270. The voltage output of each sensor assembly 270, such as the output of each sensor 272, may be adjusted based on a factor or offset to account for the variation in position with respect to the membrane 206.

In some embodiments, the sensors 272 are calibrated by supplying a known current to the electromagnet of the sensor 272 and registering the voltage output by the magnetic sensor elements and adjusting the voltage output by a factor or offset accordingly.

In some embodiments, each sensor 272 is calibrated prior to determining the size of the median gap G1. In other words, determining the size of the median gap G1 requires first calibrating each sensor 272. This calibration may include accounting for the differences in the sensitivity and position of the components of the sensor 272 as well as for the position of the underside 211 of the membrane 206. For example, the raw voltage signal output by the sensors 272 is calibrated prior to averaging the voltage signal into the average voltage that is then into the lookup table.

Each stator 230 in the array is preferably located at the same vertical position relative to the membrane 206 to facilitate levitating and moving the carrier 130. In some embodiments, the vertical position of the stators 230 relative to the membrane 206 vary. For example, the variation may be due to slight difference in the size of the stators 230 during manufacturing. As another example, positional differences between stators 230 may be the result of the attachment of the stators to the frame member 220. The controller 150 may supply a current to each stator 230 to account for the variation in the vertical position of the stators 230 to maintain the carrier 130 in a level orientation. For example, the controller 150 may supply an increased current to a stator 230 that is father away from the membrane 206 to generate a similar attraction force to stators 230 positioned closer to the membrane 206.

FIGS. 3C and 3D relate to using the voltage outputs 311, 312, and 313 of the sensor assembly 270 to determine the horizontal position of the carrier 130 along the transportation direction. The voltage outputs 311, 312, and 313 and position relative to one another are input into a Clarke transformation. The voltage outputs 311, 312, 313 are out of phase by 120 degrees due to the spacing (shown as D1 in FIG. 2D) between the sensors 272. The Clarke transformation outputs sine and cosine signals. FIG. 3C illustrates exemplary graph 330 showing a sine signal 331 and a cosine signal 332 resulting from inputting the voltage outputs 311, 312, 313 of FIG. 3A into the Clarke transformation. The sine signal 331 and cosine signal 332 are then input into a sine-cosine decoder to calculate a position angle, which consequently generates a sawtooth signal 341.

FIG. 3D illustrates exemplary graph 340 showing the sawtooth signal 341 (e.g., sawtooth wave, triangular wave) generated by inputting the sine and cosine signals 331, 332 into the sine-cosine decoder. Each tooth 342 in the sawtooth signal 341 reflects a signal corresponding with one period P1 of the sinusoidal profile of the sinusoidal element 260 that passed underneath the sensor assembly 270. In other words, each sawtooth 342 of the sawtooth signal 341 can be correlated with the length dimension of the period P1. For example, each sawtooth 342 in FIG. 3D corresponds to 80 mm along the sinusoidal element 260.

Each sawtooth 342 includes a ramp 346 followed by a sharp drop. The starting point 343 of the ramp 346 shows where one period P1 of the sinusoidal profile begins and the end point 344 of the ramp 346 shows where the period P1 ends. Each point along the ramp 346 of the sawtooth 342 between the starting point 343 and end point 344 is proportional to a length value along the period P1. In other words, the controller 150 can correlate a point along the ramp 346 of the sawtooth 342 with a point along a period P1. This point along the period P1 is associated with a length value. For example, the midpoint 345 of the ramp 346 (e.g., middle of the sawtooth 342) is equivalent to half the length of one period P1. In this example the midpoint 345 represents 40 mm.

The controller 150 can count the number of sawteeth 342 appearing in the sawtooth signal 341 as the carrier 130 passes underneath the sensor assembly 270 to determine how far the carrier 130 has traveled along the transportation direction over a time interval. For example, the controller 150 can multiply the counted number of sawteeth 342 by the known value of the length of the period P1, such as multiplying the number of sawteeth 342 by 80 mm.

The controller 150 is also able to account for partial sawteeth 342 appearing in the sawtooth signal 341 to determine the distance traveled. For example, the controller 150 may identify a partial sawtooth 342 in the graph 340 that has a partial ramp 346. The controller 150 may use the ramp 346 in one or more full sawteeth 342 to evaluate the partial ramp 346 of the identified partial sawtooth 342. For example, the controller 150 may assume that the partial ramp 346 is consistent with the same portion of a full ramp 346 of a full sawtooth 342 due to the repeating nature of the sinusoidal profile. Each point along the full ramp 346 corresponds with a different length along the period P1. Thus, the controller 150 can correlate a point along the partial ramp 346 with a length value associated with the partial period detected by the sensor assembly 270. For example, the controller 150 can correlate the end point of the partial ramp 346 with a point along a period P1, this point along the period P1 being associated with a length value.

The controller 150 adds the length associated with a partial sawtooth 342 to the number of counted full sawteeth 342 to determine the total distance traveled by the carrier 130. For example, FIG. 3D shows a portion of the sawtooth signal 341 over time interval T1 that extends along two full sawteeth 342 and one partial sawtooth 342. Time interval T1 begins at start time TO, which corresponds with the starting point 343 of a first sawtooth 342 of the sawtooth signal 341. Time interval T1 ends at time T3, which corresponds with the midpoint 345 of a third sawtooth 342. The controller 150 sums the distances associated with the two full sawteeth 342 and partial sawtooth 342 along time interval T1 to determine the distance that the carrier 130 traveled during the time interval T1. For example, if the period P1 corresponds to a distance of 80 mm, then the controller 150 determines that the carrier 130 traveled 200 mm along time interval T1.

The sinusoidal profile has a fixed number of periods P1 and partial periods since the sinusoidal element 260 as a fixed length. The sinusoidal profile of the sinusoidal element 260 also has a fixed relationship with the carrier 130. The controller 150 has the length of the sinusoidal element 260 and the number of periods P1 and partial periods P1 of the sinusoidal profile stored in the memory. The controller 150 can determine the position of the sinusoidal element 260 within the second region 208 relative to the sensor assembly 270 by analyzing the sawtooth signal 341 to determine how much of the length of the sinusoidal element 260 has passed beneath the sensor assembly 270 over time interval. The position of the sinusoidal element 260 can then be correlated with a horizontal position of the carrier 130 along the transportation direction. In other words, the controller 150 can correlate the distance traveled by the sinusoidal element 260 with the horizontal position of the carrier 130.

By way of an example, the sinusoidal element 260 may have a length of 400 mm. The sinusoidal profile may have five periods P1 along the length of the sinusoidal element 260, each period P1 extending 80 mm of the length of the sinusoidal element 260. The carrier 130 passes underneath the sensor assembly 270 over time interval T1. In this example, start time TO corresponds to when an end edge of the sinusoidal element 260 (see end edge 461 in FIG. 4) is detected by the sensor assembly 270. The controller 150 analyzes the generated sawtooth signal 341 to determine the distance traveled over time interval T1. In this example, the sawtooth signal 341 includes two full and one partial sawteeth 342. The controller 150 uses the stored information about the sinusoidal profile to analyze the sawtooth signal 341 to determine how much of the length of the sinusoidal element passed beneath the sensor assembly 270 during time interval T1. In this example, the controller 150 determines that the carrier 130 has traveled 200 mm over time interval T1 which is equivalent to half the length of the sinusoidal element 260. In other words, the controller 150 knows the location of the midpoint of the sinusoidal element 260 at end time T3. The midpoint of the sinusoidal element 260 is has a fixed relationship with the carrier 130 which allows the controller 150 to determine the horizontal position of the carrier 130 within the second region 208 with respect to the sensor assembly 270.

The controller 150 controls the stators 230 to convey the carrier 130 to one or more horizontal positions along the transportation direction within the second region 208. The controller 150 can analyze the sawtooth signal 341 to determine if the carrier 130 has moved to the desired horizontal position along the transportation direction. Additionally, the controller 150 may use the real-time position of the carrier 130 obtained by analyzing the sawtooth signal 341 to control the stators 230 to guide the carrier 130 to the desired horizontal position. Once the carrier 130 is stopped in a horizontal position, the controller 150 may then reset the determined distance of travel of the sinusoidal element 260 to zero. The controller 150 may analyze the signal 341 generated when the carrier 130 begins to move again to determine an additional distance that the sinusoidal element 260 has traveled relative to the sensor assembly 270 to determine the horizontal position of the carrier 130.

The sensor assembly 270 is disposed over empty space of the second region 208 beneath the membrane 206 when the carrier 130 is not beneath the sensor assembly 270. The sensor assembly 270 may be used to determine if the carrier 130 is disposed underneath the sensor assembly 270, such as using the sensor assembly 270 to track the position of the carrier 130 through the second region 208 of the process station 205. The size of the space beneath the sensor assembly 270 is greatly reduced when the carrier 130 moves underneath the sensor assembly 270 to fill the space and create the space 273 and median gap G1 between the carrier 130 and the membrane 206. Thus, the sensor assembly 270 may detect that the carrier 130 has moved beneath the sensor assembly 270 if the magnetic flux density meets a threshold value, such as a threshold value based on the rate of change in the magnetic flux density that indicates that the carrier 130 has moved underneath the sensor assembly 270. In some embodiments, the controller 150 may also analyze the signal to see if a sawtooth pattern appears, the appearance of which indicates that the carrier 130 is beneath the sensor assembly 270. Additionally, the controller 150 may reduce or stop current flowing to a coil within a linear stator 230 if a sensor assembly 270 detects that the carrier 130 is no longer beneath the linear stator 230, such as after the carrier 130 passes underneath the stator 230 as it travels into a different process station. The ability to monitor and control the magnetic fields generated by the stators 230, and in some cases, as discussed further below, the magnetic fields generated by the sensor assemblies 270 can be useful to avoid the generated magnetic fields from affecting the processes performed in a process station (e.g., stations 112-113 and 116-117).

For example, the sensor assembly 270 may output a voltage signal that indicates that the carrier 130 is not located underneath the sensor assembly 270, such as outputting a voltage signal that is outside of a threshold value. The threshold value may be the maximum size of a median gap G1 stored in a lookup table in the controller 150. This maximum size of the median gap G1 may be the largest dimension of the median gap G1 present when the carrier 130 is disposed under the sensor assembly 270. For example, the maximum size of the median gap G1 may be the size of the median gap G1 present when the carrier 130 is resting on a bottom surface of the process station 205 or engaged with one or more landing rails disposed underneath the carrier 130 within the second region 208. Once the carrier 130 is located underneath, the sensor assembly 270 outputs a voltage signal that is within the range of input voltages of the stored lookup table, indicating that the carrier 130 is underneath the sensor assembly 270.

FIG. 4 illustrates an example carrier 400 that includes a base 410 and the magnetic levitation elements 240 of FIGS. 2A-2D in accordance with embodiments of the present disclosure. In some embodiments, the carrier 130 described above may be implemented as the carrier 400. The carrier 400 of FIG. 4 may be similar to the carrier 130 of FIGS. 2A-2D, and everything discussed herein with respect to the carrier 130 may also apply to the carrier 400.

In some embodiments, the magnetic levitation element 240 of the carrier 400 may be coupled to the base 410. The carrier 400 may also include an opening 430 in the base 410. The carrier 400 may further include one or more substrate support members 442 coupled to the base 410 to support the object 140, each support member 442 having a support surface that the object 140 may be placed on. As shown, the features 250 and sinusoidal elements 260 are disposed on a first side (e.g., top side) of the base 410 while the support members 442 are disposed on a second side (e.g., bottom side) of the base 410.

Although the object 140 is illustrated in FIG. 4 as a substrate, the carrier 400 may also be configured to carry other objects. For example, the carrier may be configured to carry a mask, shutter, process kits parts, or other objects used in semiconductor processing, as described above.

In some embodiments, the magnetic levitation element 240 may include or be implemented as one or more rails (e.g., rails 242, 244, 246, 248). The rails 242, 244, 246, 248 may each be aligned in a certain direction relative to the base 410. In some cases, the magnetic levitation element 240 of the carrier 400 may include a first rail 242 aligned in a first direction (e.g., the X-direction). The magnetic levitation element 240 may also include a second rail 244 aligned in a second direction (e.g., the Y-direction). The magnetic levitation element 240 may also include a third rail 246 aligned in the Y-direction and is aligned parallel to the second rail 244. The magnetic levitation element 240 may also include a fourth rail 248 aligned in the X-direction, and is aligned parallel to the first rail 242. Although the carrier 400 in FIG. 4 is illustrated as having four rails 242, 244, 246, 248, however, any number of rails may be used in the carrier 400.

The dimensions of the carrier 400 (including the base 410 and the rails 242, 244, 246, 248) may be based on at least one of the size of the stations 111-118, the location of the sensor assemblies 270 in the stations 111-118, or the size of the objects (e.g., the object 140) being transported by the carrier 400. The dimensions of the carrier 400 may also be selected to facilitate the stability of the carrier 400 during transportation of the object(s) 140, as well as ensure the stability of the carrier 400 when nothing is transported. The carrier 400 may also be configured to be large enough to support the object 140 (or multiple objects 140, as described below) and small enough to pass into, through, and out of stations (e.g., stations 111-118) of a substrate processing system (e.g., substrate processing system 100), as described above.

The features 250 may be arranged on the rails 242, 244, 246, 248. In some embodiments, a pitch and/or spacing may be provided between adjacent features 250, as described above. The features 250 may also be arrange side by side. As illustrated in FIG. 4, the array of features 250 of the first rail 242 may be aligned in the X-direction along a surface of the first rail 242, the array of features 250 of the second rail 244 may be aligned in the Y-direction along a surface of the second rail 244, the array of features 250 of the third rail 246 may be aligned in the Y-direction along a surface of the third rail 246, and the array of features 250 of the fourth rail 248 may be aligned in the X-direction along a surface of the fourth rail 248. In some embodiments, the features 250 may be arranged linearly. A gap between each feature may vary between features 250, or may be the same along the rails 242, 244, 246, 248.

In some embodiments, the features 250 of the rails 242, 244, 246, 248 may cover a portion of the top of the carrier 130. The sinusoidal element 260 of the magnetic levitation elements 240 is shown adjacent to the features 250 of each rail 242, 244, 246, 248. The sinusoidal element 260 may be included on the top of one or more of the rails 242, 244, 246, 248 of the carrier 400 that is aligned with the array of features 250. In some embodiments, the magnetic levitation elements 240 may each include an outer portion and an inner portion. In these embodiments, the features 250 may be located on one or more outer portions of the magnetic levitation elements 240 and the sinusoidal element 260 may be located on one or more inner portions of the magnetic levitation elements 240, as illustrated in FIG. 4. In some embodiments, the sinusoidal element 260 may be a sinusoidal surface of the magnetic levitation element 240 rather than being an element embedded on or attached to the magnetic levitation element 240. In some embodiments, at least a portion of the base 410 may be a sinusoidal surface to enable the sensor assemblies 270 to measure and/or detect a position of the carrier 400 during contactless levitation and/or transportation. That is, at least a portion of the base 410 may function as the sinusoidal element 260.

The base 410 of the carrier 400 may be formed from a non-magnetic material and vacuum compatible material, such as metal (e.g., aluminum (Al), non-magnetic stainless steel (e.g., 316 SST) or titanium (Ti)). In some embodiments, it is beneficial to select the material from which the carrier 400 is made to include a material that can also withstand high processing temperatures. In one example, the substrate carrier 400 is made from a ceramic material (e.g., alumina, quartz, zirconia, etc.). In some cases, the substrate carrier 400 may be coated with an electrically conductive coating to resolve any charge build-up issues in the substrate carrier 400 during processing within the process station 205. In some embodiments, the rails 242, 244, 246, 248 may include a magnetic material, and the base 410 may not include a magnetic material. By using a different material in the base 410 than the rails 242, 244, 246, 248, the carrier 400 may be configured to be lighter, and/or may be cheaper to manufacture. In some embodiments, the base 410 may be made from the same material as the rails 242, 244, 246, 248. For example, the base 410 and the rails 242, 244, 246, 248, including the sinusoidal element 260, may be made of magnetic stainless steel.

FIGS. 5A and 5B are each a partial cross-section of the process station 205 that show a schematic side view of a magnetic sensor 500. Each sensor 272 of magnetic sensor assembly 270, described herein, may include the sensor 500 to detect the size of the space between the sinusoidal element 260 of a carrier, such as carrier 130 or 400, and the membrane 206. The magnetic sensor 500 includes a magnet 530, a first sensor element 550a, a second sensor element 550b, and a magnetic field permeable base 510, or for simplicity of discussion, often referred to herein as a base 510.

The base 510 has a first side 511 and a second side 512. The first and second sensor elements 550a, 550b are disposed on the first side 511. In some embodiments, the magnet 530 is disposed on the second side 512. The magnet 530 is disposed between the first and second sensor elements 550a, 550b. In some embodiments, the base 510 is a printed circuit board (PCB) with the first and second sensor elements 550a, 550b being connected to the one or more circuits formed on or within the PCB 510. The PCB 510 may be in communication with the controller 150. For example, the PCB 510 communicates the measurements and/or data obtained by the first and second sensor elements 550a, 550b to the controller 150 by delivering a measurement signal (e.g., voltage signal) to the controller 150. For example, the controller 150 may receive an output voltage signal from the magnetic sensor 500. In some embodiments, the base 510, including embodiments where the base 510 is a PCB, may be formed to include one or more recesses or pockets to at least partially receive the first and second sensor elements 550a, 550b and the magnet 530. The PCB 510 may be oriented horizontally as shown in FIG. 5A. Using a PCB as the base 510 also decreases manufacturing costs since an automated process can be used to attach the sensor elements 550a, 550b, and the magnet 530 instead of hand soldering of the components together. In some embodiments, the base 510 may include shaping features that may be attached to or integral with the base 510 to shape a magnetic field 532 emanating from the magnet 530. The shaping features may include structural elements, such as conductive portions of the base, conductive plates, sheet metal, ferromagnetic elements, or ferrite elements, etc., that are able to block and/or guide the shape of the magnetic field generated by the magnet 530.

In some embodiments, the base 510, including embodiments where the base is a PCB, may be formed from, fully coated by, or partially coated by a vacuum compatible material. In some embodiments, the first side 511 is coated with a vacuum compatible material.

The magnetic sensor 500 provides a magnetic field 532 that is modulated by the changing size of the space 273 (e.g., distance) between the upper surface 261 of the sinusoidal element 260 and the underside 211 of the membrane 206. As noted above, the surface of the sinusoidal element 260 varies in height. Thus, the size of the space 273 between the underside 211 and upper surface 261 changes in part based on the portion of the surface of the sinusoidal element 260 that is underneath the sensor segments 550a, 550b on the other side of the membrane 206 as the sinusoidal element 260 moves. Additionally, the size of the space 273 also changes as the carrier 130 changes a vertical position underneath the membrane 206. The sensor elements 550a, 550b are positioned to monitor the magnetic flux density of the magnetic field 532 passing through the sensor elements 550a, 550b. The magnetic sensor 500 outputs a voltage signal based on the detected magnetic flux density. This output voltage signal may be one of the voltage outputs 311, 312, 313 shown in FIG. 3A.

In some embodiments, the magnet 530 is a permanent magnet to generate a magnetic field 532. The permanent magnet may be a rare-earth magnet, such as a samarium-cobalt and neodymium-iron-boron magnet. The strength of the permanent magnet may be selected based on the desired amount of magnetic flux that passes through the first and second sensor elements 550a, 550b and a portion of the membrane 206 and magnetic levitation element 240. The strength of the magnet 530 may be selected based on the maximum distance that the carrier 130 can be located below the membrane 206 within the process station 205 such that the magnetic sensor 500 can sense the carrier 130. The strength of the permanent magnet is also selected to avoid adversely affecting the ability of the linear stators 230 to levitate and drive the carrier 130. If the permanent magnet is too strong, then the permanent magnet in multiple magnetic sensors 500 disposed above the carrier 130 applies a strong attraction force to the magnetic levitation elements 240 that levitates the carrier 130 and impedes the ability of the linear stator 230 to generate a magnetic field to drive the carrier 130 without contacting the membrane 206. For example, the linear stator 230 may only be able to generate a weak drive force to avoid raising the carrier 130 into contact with the membrane 206 due to the attraction of an overly strong permanent magnet, causing the carrier 130 to move at low speeds that increase operation time.

In some embodiments, the magnet 530 is an electromagnet used to generate the magnetic field 532. The electromagnet includes one or more coils, each coil having one or more turns. In some embodiments, the one or more coils may be one or more layers of coils, such as one or more layers of planar coils oriented parallel to a longitudinal axis 501 of the base 510. In some embodiments, the one or more coils may be disposed in the base 510, such as being printed in the PCB. A current, such as a direct current (DC) or an alternating current (AC), is supplied to the at least one coil to generate the magnetic field 532. The current may be supplied from a constant current source, such as an AC or DC constant current source, such that the electromagnet generates a field with a consistent strength.

An electromagnet may be preferable to a permanent magnet in some embodiments of the magnetic sensor 500. The strength of a magnetic field generated by a permanent magnet fluctuates based on temperature. Additionally, certain temperatures can cause irreversible or permanent losses in the strength of a permanent magnet. An electromagnet can be controlled to generate a consistent magnetic field as the temperature fluctuates within the first region 207. The temperature within the first region 207 may change based on heat generated when the substrate 140 is processed within a processing region of the station 205. Thus, the magnet 530 may be an electromagnet where the temperature within the first region 207 fluctuates significantly or reaches temperatures that would otherwise cause losses in the strength of a permanent magnet. Additionally, electromagnets may be turned off when desired unlike permanent magnets to stop the generating of the magnetic field 532. Additionally, electromagnets may also be powered down, and thus not fully turned-off, to decrease the strength of the magnetic field. For example, the electromagnet may be powered down by decreasing the current to decrease the strength of the magnetic field 532. Thus, using electromagnets instead of permanent magnets allows for the strength of the magnet 530 in one or more magnetic sensors 500 disposed in the process station to be adjusted to manage the attractive force exerted on the carrier 130 and to mitigate the effect of the magnet 530 on processes within a processing region of the process station.

In some embodiments, the magnet 530 is an electromagnet with a current supplied by an AC current source, such as an AC constant current source. The frequency of the AC current source may be selected to avoid or mitigate the effect of an eddy current induced in the membrane 206 and the sinusoidal element 260. For example, the frequency of the AC current supplied to the one or more coil of the magnet 530 may be between about 1 kHz and about 3 k Hz, such as 1 kHz, such as about 1.5 kHz, such as 2 kHz, such as about 2.5 kHz, such as about 3 kHz. Additionally, the membrane 206 and sinusoidal element 260 are preferably formed from a material having a high electric resistivity to keep the induced eddy currents low when the magnet 530 is an electromagnetic coupled to an AC current source. For example, the membrane 206 and the sinusoidal element 260 may be formed from ferrite or a ferritic steel. As another example, the sinusoidal element 260 may be formed from a magnetic stainless steel (e.g., 409, 430 and 439) and the membrane 206 may be formed from a non-magnetic stainless steel (e.g., 301, 304, T304, 316) or even ceramics.

The magnet 530 is vertically oriented such that the poles (e.g., North and South poles) extend in the vertical direction (e.g., Z-direction). In other words, the magnetic axis 539 of the magnet 530 is perpendicular or substantially perpendicular to the longitudinal axis 501 of the base 510, and also preferably perpendicular to the surface of the sinusoidal element 260 of a magnetic levitation element 240. At least during operation, the magnet 530 generates the magnetic field 532 shown as arrows that extends across the membrane 206 into the second region 208, and may even pass through the carrier 130. The magnetic field 532 extends from opposing lateral sides of the magnet 530. The magnetic field 532 extending from one lateral side of the magnet 530 circulates in an opposite direction from the field extending from the other lateral side of the magnet 530. This magnetic field 532 includes a first and second usable field portion 531a, 531b on opposing lateral sides of the magnet 530 as shown by the arrows in FIG. 5A. The first and second usable field portions 531a, 531b circulate in opposing directions and have the same or roughly the same field strength. The first and second usable field portion 531a, 531b pass through the first and second sensor elements 550a, 550b, respectively, above the membrane 206 and pass through the first sensor element 550a and second sensor element 550b in at least one opposing direction, such as at least a portion of first and second usable field portions 531a, 531b passing through the first and second sensor elements 550a, 550b in the +X-direction and −X-directions, respectively.

In some embodiments, the thickness of the base 510 is selected such that the first and second useable field portions 531a, 531b generated by the magnet 530 pass through the first and second sensor elements 550a, 550b, respectively. In some embodiments, the base 510 may be a PCB with a spacer material disposed between the magnet 530 and the second side 512 to increase the distance between the magnet 530 and the first and second sensor elements 550a, 550b.

The first and second sensor elements 550a, 550b are magnetic field sensor elements configured to measure the magnetic flux density. Changes in the magnetic flux density are used to determine the position of the carrier 130. For example, the first and second sensor elements 550a, 550b may be configured to convert the magnetic flux density into a voltage signal that is sent to the controller 150, such as one of voltage outputs 311, 312, 313.

While the first and second sensor elements 550a, 550b are shown disposed on the first side 511, the sensor elements 550a, 550b may be disposed on the second side 512 or embedded in the base 510. In some embodiments, the sensor 500 is disposed in second region 208 rather than in first region 207. The base 510 may be a barrier between second region 208 and another region of the station 205 at an atmospheric pressure. Thus, the first side 511 may experience vacuum conditions while the second side 512 is exposed to atmospheric conditions. The first side 511 may be the datum, similarly to the underside 211 of the membrane 206, to measure the gap G1. In some embodiments, the membrane 206 is omitted but the base 510 is configured to be a barrier between the second region 208 and another region of the station 205 that is at a different pressure, such as atmospheric pressure. The first side 511 may be the datum, similarly to the underside 211 of the membrane 206, to measure the gap G1.

The linear stator 230 generates a magnetic field to levitate and/or drive the carrier 130. Part of this generated field will become a stray field that interacts with the sensor 500. The horizontal component of the stray field from the linear stator 230 (not shown) positioned on the right side of the sensor 500, shown by arrow labeled F, is weaker than the vertical component of the stray field generated by the linear stator 230. The horizontal component of the stray field F is weaker than the vertical component because, at least in part, the coils (not shown) of the linear stator 230 are substantially vertically wound. In some embodiments, and as shown in FIG. 5A, the first and second sensor elements 550a, 550b are oriented to measure the magnetic flux density in the horizontal direction (e.g., in the horizontal plane of the X, Y axis). In other words, the first and second sensor elements 550a, 550b may be used to detect the horizontal component of a magnetic flux density vector, such as the x-component of the generated magnetic fields. Without being bound by theory, orienting the sensor elements 550a, 550b to measure the magnetic flux density in the horizontal direction minimizes or eliminates the effect of the vertical component of the stray field on the sensor elements 550a, 550b. The first and second sensor elements 550a, 550b may be a GMR element, a TMR element, a Hall Effect element, or other suitable magnetic field sensor element. In some embodiments, there is a clearance 271 between the sensor elements 550a, 550b and the membrane 206 such that the membrane 206 is not in contact with the sensor elements 550a, 550b.

Additionally, the first and second sensor elements 550a, 550b are separated by a distance X1, such being 10 mm or less than 10 mm apart, such as 9 mm apart, such as 8 mm apart, such as 7 mm apart, such as 6 mm apart, such as 5 mm apart, such as 4 mm apart, such as 3 mm apart, such as 2 mm apart, such as 1 mm apart. This distance is small enough that the horizontal stray field F experienced by both the first and second sensor elements 550a, 550b is roughly the same or is at least at a constant ratio between the two sensor elements 550a, 550b. This allows the controller 150 to compensate for the effect of the horizontal stray field F since the sensor elements 550a, 550b experience the horizontal stray field F in the same direction and experience respective useable field portions 531a, 531b that are circulating in opposing directions.

For example, the horizontal component of the magnetic flux density detected by the first sensor element 550a is $B_1$ and the horizontal component of the magnetic flux density detected by the second magnet field sensor element 550b is $B_2$. The first sensor element 550a experiences the horizontal component of the flux density of the magnetic stray field F ($B_{stray}$) and the horizontal component of the flux density of the first useable field portion 531a ($B_{Useable}$) generated by the magnet 530. The second sensor element 550b experiences the horizontal component of the flux density of the magnetic stray magnetic field F ($B_{stray}$) and the horizontal component of the flux density of the second useable field portion 531b ($B_{Useable}$) which is the same as the first useable field portion 531a but in an opposite direction. The horizontal component of the usable field portions 531a, 531b are shown as x-component 591 of vector 590 in FIG. 5A x-component 591a of vector 590a in FIG. 5B. The stray field F generated by the adjacently positioned linear stator 230 is substantially in the same direction for each sensor element 550a, 550b and is assumed to have the same flux density based on the positioning of the two sensor elements 550a, 550b. Based on a system of equations, the controller can determine a difference in the magnetic flux density ($B_1$-$B_2$) detected by the first and second sensor elements 550a, 550b that can be correlated to a size of the space 273 underneath the magnetic sensor 500:

$$B_1 = B_{stray} + B_{Useable}$$

$$B_2 = B_{stray} - B_{Useable}$$

$$B_1 - B_2 = 2(B_{Useable})$$

FIG. 5A shows the carrier 130 in a first position in the Z-direction close to the membrane 206. FIG. 5B shows the carrier 130 in a second position in the Z-direction, having moved in the negative Z-direction, such that the carrier 130 is farther away from the membrane 206. Thus, the space 273 in FIG. 5A is smaller than the space 273 in FIG. 5B. The sensor elements 550a, 550b are configured to sense the x-component of a magnetic flux density vector. In other words, the sensing direction of the sensor elements 550a, 550b is in the x-direction. As will be explained below, each sensor element 550a, 550b will sense the x-component that extends in opposing direction, such as the sensor element 550a sensing an x-component extending in the positive x-direction and sensor element 550b sensing an x-component extending in a negative x-direction. The magnet 530 is vertically orientated, and the poles extend in a vertical direction (e.g., extend in the z-direction) that is perpendicular to the sensing direction (e.g., x-direction) of the sensor elements 550a, 550b.

FIG. 5A shows the vector 590 of the magnetic flux density of the useable field 531a, 531b passing through the sensor elements 550a, 550b, respectively. The vector 590 has an x-component 591 that is measured by the magnetic sensor 550a, 550b. The z-component of the vector 590 is not shown. As shown in FIG. 5A, the x-component 591 experienced by the first sensor element 550a extends in a first direction (e.g., positive x-direction) and the x-component 591 experienced by the second sensor element 550b extends in a second direction (e.g., negative x-direction) that is opposite of the first direction.

FIG. 5B shows the change in the vector (now shown as vector 590a) of the magnetic flux density after the carrier 130 is moved to the second position to increase the size of the space 273. The x-component of the magnetic flux density vector increased as the size of the space 273 increased while the magnitude of the magnetic flux density decreased as the space 273 increased.

As shown in FIGS. 5A and 5B, the change in the size of the space 273 modulates the detected magnetic flux density. FIG. 5B shows that the vector 590a has decreased in magnitude due to the increase in the size of the space 273. The vector 590a shown in FIG. 5B has an x-component 591a that is larger than the x-component 591 of vector 590 shown in FIG. 5A due to the change in the size of the space 273.

The voltage signal produced by the sensor elements 550a,b is proportional to the detected magnetic flux density. Thus, the controller 150 may use the voltage signal to calculate the magnetic flux density detected by the sensor 500.

In some embodiments, where the magnet 530 is an electromagnet, the voltage signal may be similar to the waveform (e.g., sinusoidal) of the AC current supplied to the electromagnet to generate the magnetic field 532. The voltage signal may be analyzed to differentiate the signal corresponding with the size of the space 273 from stray fields, such as stray fields generated by the stator 230. For example, the peak-to-peak voltage of the voltage signal may be detected and correlated with the size of the space 273. For example, the voltage output signals 311, 312, and 313 in FIG. 3A may represent the detected peak-to-peak voltage from the voltage signal output by each sensor 272.

In some embodiments, the sensor elements 550a,b are configured to detect the x-component of the magnetic flux density vector. The sensor 500 may output a voltage signal, such as one of voltage outputs 311, 312, 313 shown in FIG. 3A, based on the differences in the x-component of magnetic flux density vector detected by the sensor elements 550a,b.

Each of the three sensors 272 of the sensor assembly 270 may include one magnetic sensor 500. In some embodiments, the three magnetic sensors 500 of the three sensors 272 share the same base 510. For example, sensors 272 may include a single PCB 510 with three sets of magnets 530 and corresponding sensor elements 550a, 550b being disposed at distance D1 (e.g., 120 degrees along the sinusoidal profile of the sinusoidal element 260) along the single PCB 510.

The sensor 500 may be calibrated to compensate for differences in the sensitivity and position of the components of the sensor 500. For example, each sensor element 550a,b may output different voltage outputs for the same experienced x-component of a magnetic flux density vector. Additionally, the first sensor element 550a may be closer to the membrane 206 than the second sensor element 550b. Thus, the voltage signal output of one or both of the magnetic sensor elements 550a, 550b may be inaccurate. The sensor 500 may be calibrated to account for the inaccuracy in the signal produced by each sensor element 550a, 550b. For example, the controller 150 or processor of the sensor 500 may adjust the voltage signal received by one or both of the sensor elements 550a,b by a factor or offset to correct for the error.

In some embodiments, each sensor 500 is calibrated by engaging the carrier 130 with the underside 211 of the membrane 206 to determine the position of the sensor 500, such as the position of each sensor element 550a, 550b relative to the underside 211 of the membrane 206. For example, the carrier 130 may be engaged with the membrane 206 to determine the position of the sensors 272 relative to the underside 211. The voltage output of each sensor 500, such as the output of each sensor element 550a, 550b, may be adjusted based on a factor or offset to account for the variation in position with respect to the membrane 206.

In some embodiments, the sensor 500 are calibrated by supplying a known current to the one or more coils of the magnet 530 of the sensor 500 and registering the voltage output by the magnetic sensor elements 550a, 550b and adjusting the voltage output by a factor or offset accordingly.

As described above, the sensor assembly 270 is able to use the sinusoidal profile of the sinusoidal element 260 to determine a vertical and horizontal position of the carrier. In some embodiments, a process station may instead have separate sensors for determining the vertical and horizontal position of the carrier.

FIGS. 6A and 6B illustrate partial views of a portion of process station 600. The process station 600 shown in FIGS. 6A and 6B has similar components of process station 205 shown in FIGS. 2A-2D as indicated by the reference signs without reciting the description of these components for brevity. The process station 600 includes one or more magnetic levitation actuator assemblies 620 disposed in the first region 207. Similar to the magnetic levitation actuator assembly 120a, the magnetic levitation actuator assembly 620 includes linear array of stators 230 to levitate and convey a carrier 630 disposed in the second region 208. The magnetic levitation actuator assembly 620 further includes one or more first sensor assembly 670 and one or more second sensor assemblies 680. Each first sensor assembly 670 uses sinusoidal element 260 on the carrier 630 to determine a horizontal position of the carrier 630 along the transportation direction. Each second sensor assembly 680 uses a featureless element 660 to determine a vertical position of the carrier 630. The magnetic levitation actuator assembly 620 further includes the frame member 220, and the stators 230, first sensor assemblies 670, and second sensor assemblies 680 are attached to the frame member 220.

FIG. 6C illustrates the exemplary carrier 630. The carrier 630 may be similar to carrier 130 or carrier 400. The carrier 630 has similar components as both the carrier 130 and carrier 400 as indicated by the reference signs without reciting the description of these components for brevity. The carrier 630 receives an object 140. The carrier 630 is levitated and conveyed in the second region 208 by the stators 230. The carrier 630 may include at least one magnetic levitation element 240 that has a linear array 251 of features 250. The magnetic levitation element 240 may also include a sinusoidal element 260. The magnetic levitation element 240 may also include a featureless element 660. The featureless element 660 includes a planar (e.g., flat) upper surface 661. The featureless element 660 may span the same or part of the length of the array of features 250. The sinusoidal element 260 and featureless element 660 may run parallel to one another along the carrier 630. The featureless element 660 may be formed from a ferrous material, such as being a strip of ferromagnetic material embedded in or attached to the carrier 630. For example, the featureless element 660 may be made of a magnetic stainless steel. In some embodiments, the featureless element 660 may be made from the same material as the sinusoidal element 260. In some embodiments, the featureless element 660 is a planar portion of a surface of the carrier 630 or magnetic levitation element 240 rather than an element attached to or embedded in the body of the carrier 630.

As shown in FIG. 6C, the featureless element 660 runs parallel to each sinusoidal element 260 of the carrier 630. In other words, each rail 242, 244, 246, 248 may include both a sinusoidal element 260 and a featureless element 660. A separate magnetic levitation actuator assembly 620 may be disposed over each rail 242, 244, 246, and 248.

FIG. 6A illustrates a schematic partial cross-sectional view of the process station 600 to illustrate the magnetic levitation actuator assembly 620 and carrier 630. The first sensor assembly 670, second sensor assembly 680, and stator 230 are shown adjacent one another in the Y-direction. The first sensor assembly 670, second sensor assembly 680, and stator 230 are each attached to the frame member 220. The frame member 220 may extend along the x-direction above the membrane 206. A plurality of stators 230 may be attached to the frame member 220 arranged in a linear array (e.g., row) that is parallel to a linear array of first sensor assemblies 670 attached to the frame member 220. Additionally, the linear array of stators 230 and linear array of first sensor assemblies 670 may each be parallel to a linear array of second sensor assemblies 680. The frame member 220 may be attached to a wall of the process station 600 in the first region 207 to maintain a fixed distance between the top side of the membrane 206 and the first sensor assemblies 670, second sensor assemblies 680, and stators 230. In some embodiments, each first sensor assembly 670 and second sensor assembly 680 are positioned over the membrane 206 or in a respective recess formed in the membrane 206 such that the first sensor assembly 670 and second sensor assembly 680 are not in contact with the membrane 206. In other words, a clearance 671 may be present between the membrane 206 and the first sensor assembly 670 and a clearance 681 may be present between the membrane 206 and the second sensor assembly 680.

The stator 230 is shown in FIG. 6A directly above the one or more features 250 of the magnetic levitation element 240 of the carrier 630 that are located on the other side of the membrane 206. The first sensor assembly 670 is positioned adjacent to the stator 230 and is directly above the upper surface 261 of the sinusoidal element 260 of the carrier 630. The first sensor assembly 670 uses the sinusoidal profile of the sinusoidal element 260 to determine a horizontal position of the carrier 630 within the second region 208. The second sensor assembly 680 is positioned adjacent to the first sensor assembly 670 and is directly above the planar upper surface 661 of the featureless element 660. The second sensor assembly 680 uses the planar upper surface 661 of the featureless element 660 to determine a vertical position of the carrier 630 within the second region 208.

A gap G2 is present between the planar upper surface 661 of the featureless element 660 and the underside 211 of the membrane 206. The planar upper surface 661 provides a uniform surface for each second sensor assembly 680 to detect. The second sensor assembly 680, which positioned a fixed distance from the membrane 206, is able to detect changes in the size of the gap G2 (e.g., distance between the membrane 206 and the featureless element 660) through the membrane 206 such that the controller 150 is able to determine the position of the carrier 630 underneath the second sensor assembly 680 in the Z-direction.

In some embodiments, the second sensor assembly 680 includes one magnetic field detection sensor. The magnetic field detection sensor may have one or more magnets and one or more magnetic field sensor elements that are able to detect changes in magnetic flux density of a magnetic field generated by the one or more magnets in the second sensor assembly 680 as the size of the gap G2 changes. The one or more magnets may be each be a permanent magnet or an electromagnet. Electromagnets can be fully or partially turned-off (e.g., powered down) unlike a permanent magnet. The magnetic field sensor element may be a Hall Effect element, a giant magnetoresistance (GMR) element, a tunnel magnetoresistance (TMR) element, or other suitable magnetic field sensor element. The second sensor assembly 680 may include be or may incorporate the sensor 272. In some embodiments, the second sensor assemblies 680 may be or may incorporate the magnetic sensor 500 shown in FIGS. 5A and 5B. The size of the gap G2, similar to the size of the space 273 as discussed in relation to FIGS. 5A and 5B, modulates the magnetic field of the one or more magnets of the second sensor assembly 680 so that the magnetic flux density detected by the one or more magnetic field sensor element varies based on the size of the gap G2. The configuration of the magnets and relative position of the magnetic field sensor elements to the magnets affects whether increasing the size of the gap G2 increases or decreases the magnetic flux density measured by the magnetic field sensor elements. The second sensor assembly 680 may convert the magnetic flux density detected by the sensor elements into a voltage signal that can be used by the controller 150 or processor on the second sensor assembly 680 to determine the size of the gap G2. The dimension of the gap G2 may be determined by correlating the voltage signal generated by the second sensor assembly 680 to the size of the gap G2. For example, controller 150 may have a lookup table stored in the memory that indexes the voltage of the voltage signal to a corresponding size of the gap G2.

The one or more magnetic field sensor elements of second sensor assembly 680 may measure one or more components of a magnetic flux density vector, such as the x-component of the magnetic flux density vector, to determine the size of the gap G2. For example, the magnetic field sensor elements may measure the x-component of the magnetic flux density vector to determine the size of the gap G2.

In some embodiments, where the one or more magnet of the second sensor assembly 680 is an electromagnet, the voltage signal may be similar to the waveform (e.g., sinusoidal) of the AC current supplied to the electromagnet to generate the magnetic field. The voltage signal may be analyzed to differentiate the signal corresponding with the size of the gap G2 from stray fields, such as stray fields generated by the stator 230. For example, the peak-to-peak voltage of the voltage signal may be detected and correlated with the size of the gap G2, such as inputting the peak-to-peak voltage into a look-up table to output a dimension of the gap G2.

In some embodiments, the voltage signal produced by the second sensor assembly 680, such as magnetic sensor 500, does not have a linear relationship to the size of the gap G2. In other words, a unit increase in the voltage does not indicate the same unit increase in the size of the gap G2. Therefore, the voltage signal is linearized to determine the size of the gap G2 detected by the second sensor assembly 680.

The controller 150 may have a lookup table stored in the memory to linearize the voltage signal from the second sensor assembly 680. The lookup table includes one or more inputs that are each indexed to an output. Each input corresponds to a voltage. The output is a size of the gap G2 that corresponds to the voltage. The controller 150 inputs the voltage of the voltage signal to output the size of the gap G2.

The controller 150 may control the position of the carrier 630 in the Z-direction based on the size of the gap G2 detected by one or more of the second sensor assemblies 680. In some embodiments, the controller 150 may adjust the current to the linear stators 230 to maintain the size of the gap G2. For example, the gap G2 may be maintained at a distance less than 10 mm, such as 9 mm, such as 8 mm, such as 7 mm, such as 6 mm, such as 5 mm, such as 4 mm, such as 3 mm, such as 2 mm, such as 1 mm. In some embodiments, the process station 600 is arranged such that the gap G2 is in either the X-direction or Y-direction rather than the Z-direction. The controller 150 may use the second sensor assembly 680 to control the size of the gap G2 in the X-direction and/or Y-direction.

The controller 150 may maintain the size of the gap G2 by closed loop control. For example, the controller 150 may have a desired distance of the gap G2 as a stored value, such as a gap distance of 5 mm. The controller 150 may use the second sensor assemblies 680 to determine the size of the gap G2 present between the membrane 206 and the featureless element 660. If the detected size is equal to the stored value, then the controller 150 does not cause the stators 230 to adjust the z-position of the carrier 630. The controller 150 may also not cause the linear stators 230 to adjust the z-position of the carrier 630 if the detected size is within a threshold range of the stored value. For example, the threshold range may be 1 mm, such as 0.9 mm, such as 0.8 mm, such as 0.7 mm, such as 0.6 mm, such as 0.5 mm, such as 0.4 mm, such as 0.3 mm, such as 0.2 mm, such as 0.1 mm. In other words, the controller 150 may not adjust the z-position of the carrier 630 if the detected position is within the threshold range, such as being within plus or minus 0.5 mm of 5 mm as an example. If the controller 150 determines that the detected position is outside of the threshold range, then the controller 150 causes the stators 230 to adjust the z-position of the carrier 630 to return the size of the gap G2 to the stored value. Additionally, the gap size detected by each second sensor assembly 680 may differ if the carrier 630 is not level. The controller 150 may use the distance detected by each second sensor assembly 680 to adjust the pitch or tilt of the carrier 630 to return the carrier 630 to a level orientation. This process may repeat cyclically during the operation of the process station 600 to maintain the desired size of the gap G2, and thus z-position of the carrier 630.

The second sensor assemblies 680 may be calibrated to compensate for differences in the components of the second sensor assembly 680, such as variations in the sensitivity of the components or for variations in the position of the components. For example, each sensor element, such as sensor elements 550a, 550b, may output different voltages for the same experienced a magnetic flux density. As another example, one sensor element may be closer to the membrane 206 than the other sensor element. Thus, the voltage signal output of the one or more sensor elements may be inaccurate. The second sensor assembly 680 may be calibrated to account for the inaccuracy in the signal produced by each sensor element. For example, the controller 150 or processor of the second sensor assembly 680 may adjust the voltage output the sensor elements by a factor or offset to correct for the error.

In some embodiments, the underside 211 of the membrane 206 is used as a datum to determine the size of the gap G2. As explained above, the membrane 206, however, may deform (e.g., bow, deflect) during operation of the process station 600. Thus, the underside 211 of the membrane 206 may not be a uniform flat surface but instead may vary along the length of the membrane 206.

In some embodiments, the controller 150 compensates for the variations in the position of the underside 211. To compensate for the variations in the position of the underside 211 of the membrane 206, the carrier 630 is periodically raised into engagement with the membrane 206 as the carrier 630 is transported through the second region 208. The controller 150 may use the information obtained by one or more second sensor assemblies 680 while the carrier 630 is engaged with the membrane 206 to determine the position of the underside 211 of the membrane 206 to calibrate the one or more second sensor assemblies 680.

For example, the carrier 630 may be lifted to engage the top surface 212 of the features 250 with the membrane 206. The top surface 212 of the features 250 have a fixed position relative to the carrier 630, such as having a fixed position relative to the featureless element 660. The second sensor assemblies 680 then determine the size of the gap G2 present while the carrier 630 is engaged with the membrane 206. Each second sensor assembly 680 may detect a different size of the gap G2 based on the variation of the deformation of the membrane 206 underneath the specific second sensor assembly 680. The detected gap G2 may then be compared to a second reference gap size R2. The second reference gap size R2 is the size of the gap G2 that would be present if the underside 211 of the membrane 206 was undeformed.

FIG. 6A shows the second reference gap size R2 as the differential between the top surface 212 of the feature 250 and the planar upper surface 661 of the featureless element 660. In some embodiments, the controller 150 uses the differential in the detected gap size and the reference second gap size R2 to determine the actual position of the underside 211 of the membrane 206 underneath each second sensor assembly 680. The controller 150 then calibrates the output of a second sensor assembly 680 based on the actual position of the underside 211 of the membrane 206 beneath the second sensor assembly 680 to determine the size of the gap G2. In other words, the controller 150 uses the determined position of underside 211 of the membrane 206 as the datum for the second sensor assembly 680. The second sensor assembly 680 may be calibrated by adjusting the voltage output of each second sensor assembly 680 by a factor or offset to account for the position of the underside 211 of the membrane 206.

The controller 150 may repeatedly engage the carrier 630 with the membrane 206 to calibrate the second sensor assembly 680. For example, the controller 150 may cause the stators 230 to lift the carrier 630 into engagement with the membrane 206 after the carrier 630 travels a distance in the transportation direction to allow the controller 150 to calibrate the second sensor assemblies 680 above the carrier 630. This distance may be equivalent to the length of one stator 230.

In some embodiments, the second sensor assemblies 680 are calibrated by engaging the carrier 630 with the underside 211 of the membrane 206 to determine the position of each first sensor assembly 680 relative to the membrane 206, such as the position relative to the underside 211. Each second sensor assembly 680 in the linear array of second sensor assemblies 680 may vary in position relative to the membrane 206. Additionally, the magnetic field sensor elements in each second sensor assembly 680 may vary in position relative to the membrane 206. Engaging the carrier 130 with the membrane 206 allows the controller 150 to determine the variations in position of each second sensor assembly 680 and the magnetic field sensor elements. The voltage output of each second sensor assembly 680, such as the output of each magnetic field sensor element, may be adjusted based on a factor or offset to account for the variation in position with respect to the membrane 206.

In some embodiments, the second sensor assemblies 680 are calibrated by supplying a known current to the electromagnet of the second sensor assembly 680 and registering the voltage output by the magnetic sensor elements and adjusting the voltage output by a factor or offset accordingly.

In some embodiments, the second sensor assembly 680 is calibrated prior to determining the size of the gap G2. In other words, determining the size of the gap G2 requires first calibrating the second sensor assembly 680 and then comparing the voltage signal to the associated output value of the lookup table. This calibration may include accounting for the differences in the sensitivity and position of the components of the second sensor assembly 680 as well as for the position of the underside 211 of the membrane 206. For example, the raw voltage signal output by the sensor elements, such as the sensor elements 550a, 550b, is calibrated prior to inputting the voltage signal into the lookup table. Thus, the calibrated voltage may be the input of the lookup table that is associated with an output that corresponds with the size of the gap G2.

FIG. 6B is a schematic side view of the process station 600 that illustrates first sensor assemblies 670 on opposing sides of a stator 230 positioned in the first region 207 above a portion of the carrier 630 that is disposed in the second region 208. The first sensor assemblies 670 are positioned above the sinusoidal element 260. FIG. 6B also shows a cross-section of the sinusoidal element 260 that shows the sinusoidal profile formed by the upper surface 261. The size of the space 273 present between the upper surface 261 and the underside 211 varies across the length of the sinusoidal element 260 due to the periodic nature of the sinusoidal profile.

Each first sensor assembly 670 includes two magnetic field detection sensors 272 to detect changes in the size of the space 273 between upper surface 261 and the underside 211 as the sinusoidal element 260 moves within the second region 208. The first sensor assemblies 670 and/or controller 150 also use the information obtained from the two sensors 272 to determine the horizontal position of the carrier 630 along the transportation direction. Each sensor 272 of the first sensor assembly 670 may be connected to the controller 150.

As shown in FIG. 6B, the two sensors 272 of each first sensor assembly 670 are arranged in a linear array. The two sensors 272 in each first sensor assembly 670 are spaced apart by a distance D2 (e.g., spacing distance) to sense the size of the space 273 between the underside 211 and a different part of the sinusoidal profile. Thus, each sensor 272 is used to detect a size of the space 273 at different points along the upper surface 261.

FIG. 6B shows a first distance C1 and a second distance C2. Each of the first distance C1 and second distance C2 represent a different size of the space 273 underneath each sensor 272 between the underside 211 and a point along the upper surface 261. Each of the first distance C1 and second distance C2, are separated by the spacing distance D2 due to the positioning of the two sensors 272 of the first sensor assembly 670. In other words, the two sensors 272 are spaced apart by distance D2 such that each sensor 272 is disposed over a different point along the upper surface 261, each of those points along the upper surface 261 similarly being spaced apart by distance D2. In some embodiments, distance D2 is equivalent to 90 degrees along the sinusoidal profile of the sinusoidal element 260. For example, distance D2 may be 20 mm, which is equivalent to 90 degrees along a period P1 that extends along a length of 80 mm. Thus, the spacing distance D2 of the sensors 272 is the desired distance between points along the upper surface 261 rather than a distance between sides of the sensors 272 shown as S1.

The controller 150 is able to analyze the signal output from the two sensors 272 of the first sensor assemblies 670 to determine the horizontal position of the carrier 630 within the second region 208. For example, the first sensor 272, being the left-most sensor 272 of the first sensor assembly 670 on the left-hand side of the stator 230, may output a first signal based on the detected dimension of first distance C1. The second sensor 272, being the right-most sensor 272 of the first sensor assembly 670 on the left-hand side of the stator 230, may output a second signal based on the detected dimension of second distance C2. The controller 150 analyzes the first signal and second signal to determine a horizontal position of the carrier 630 along the transportation direction. The controller 150 may also analyze the signals output by the two sensors 272 of the first sensor assembly 670 on the right-hand side of the linear stator 230 to determine the horizontal position of the carrier 630.

FIG. 7A illustrates an exemplary graph 730 showing the voltage output of the two sensors 272 of one first sensor assembly 670 over time. Each voltage output reflects the magnet flux density detected by the one or more sensor elements of the sensor 272 over time due to the changing size of the space 273 underneath each sensor 272 caused by the movement of the sinusoidal element 260. Each sensor 272 outputs a different voltage signal, shown as voltage outputs 731, 732 in FIG. 3A. The first voltage output 731 corresponds to the detected first distance C1, the second voltage output 732 corresponds to the detected second distance C2.

The voltage outputs 731, 732 are sinusoidal due to the sinusoidal profile of the sinusoidal element 260. The voltage outputs 731, 732 are out of phase by 90 degrees due to the spacing (e.g., distance D2) of the sensors 272 in the first sensor assembly 670. As shown in FIG. 7A, the first voltage output 731 is a sine signal and the second voltage output 732 is a cosine signal due to the two sinusoidal signals being offset by 90 degrees. The first voltage output 731 and second voltage output 732 are then input into a sine-cosine decoder to calculate a position angle, which consequently generates a sawtooth signal. This sawtooth signal is then analyzed to determine a horizontal position of the carrier 630.

Using the first sensor assembly 670 allows the controller 150 to omit the operation of processing three sensor outputs through a Clarke transformation to generate a sine and cosine signal that is then input into a sine-cosine decoder. While the Clarke transformation operation is omitted, the first sensor assembly 670 is unable to produce three signals that can be averaged to determine the vertical position of the carrier 630 within the second region 208. The second sensor assembly 680 is instead used to determine the vertical position of the carrier 630 as explained above.

FIG. 7B illustrates exemplary graph 740 showing the sawtooth signal 741 (e.g., sawtooth wave, triangular wave) generated by inputting the voltage outputs 731, 732 (e.g., sine and cosine signals) into the sine-cosine decoder. The sawtooth signal 741 shown in FIG. 7B is similar to the sawtooth signal 341 shown in FIG. 3D. As explained above, each tooth 342 in the sawtooth signal 341 reflects a signal corresponding with one period P1 of the sinusoidal profile of the sinusoidal element 260 that passed underneath the sensor assembly 270. In other words, each sawtooth 342 of the sawtooth signal 341 can be correlated with the length dimension of the period P1. The controller 150 can analyze sawtooth signal 741 similarly to sawtooth signal 341 to determine a horizontal position of the carrier 630 along the transportation direction. By way of example, FIG. 7B shows a time interval T1 starting at TO and ending at T3. In this example, the period P1 of the sinusoidal element 260 is 80 mm and the sinusoidal element 260 has five period P1. The controller 150, using the stored information about the carrier 630 and sinusoidal element 260, is able to determine that the carrier has traveled 200 mm at the end time T3 based on the sawtooth signal 741. Thus, the controller 150 knows the location of the mid-point of the sinusoidal element 260, and thus the carrier 630, relative to the first sensor assembly 670 at end time T3.

In some embodiments, the first sensor assemblies 670 may be calibrated to account for the position of the underside 211 underneath a first sensor assembly 670 while a second sensor assemblies 680 is calibrated. For example, the controller 150 may use the position of the underside 211 detected by a second sensor assembly 680 to calibrate a first sensor assembly 670 adjacent to the second sensor assembly 680, such as by adjusting the voltage output of each sensor 272 of the first sensor assembly 670 by a factor or offset to account for the position of the underside 211 of the membrane 206. Additionally, the sensors 272 may be calibrated to account for differences between the sensitivity and/or position of the components of each sensor 272, such as adjusting the voltage output by a factor or offset.

The controller 150 may use the known position of the carrier 630 within the station to selectively turn-on, turn-off, and/or power down the first sensor assembly 670 and the second sensor assembly 680. For example, the controller 150 may turn-off or power down one or more first sensor assemblies 670 and one or more of the second sensor assemblies 680 when the controller 150 knows that the carrier 130 is not underneath the sensor assemblies 670, 680. In other words, the controller 150 may turn on one or more of the first sensor assemblies 670 and second sensor assemblies 680 located in a position above the known position of the carrier 630 to take a measurement.

In some embodiments, the membrane 206 may be formed from a transparent material and the sensors 272 of the sensor assembly 270, the sensors 272 of the first sensor assembly 670, and the sensor of the second sensor assembly 680 may each be may be optical sensors (e.g., camera, laser sensor) that detect the carrier, such as carrier 130, 400, through the transparent membrane. For example, the membrane 206 may be formed from a glass material. For example, the membrane 206 may be formed from a quartz, such as transparent quartz.

As one example, the membrane 206 in the process station 205 shown in FIGS. 2A-2D may be transparent and each sensor 272 of the sensor assembly 270 is an optical sensor configured to sense the sinusoidal element 260 through the membrane 206. Each optical sensor 272 outputs a voltage signal that corresponds to the size of the space 273. Thus, the first voltage output 311, second voltage output 312, and third voltage output 313 may be the voltage signals from an optical sensor.

As one example, the membrane 206 in the process station 600 shown in FIGS. 6A-6B may be transparent and each sensor 272 of the first sensor assembly 670 is an optical sensor configured to sense the sinusoidal element 260 through the membrane 206. Each optical sensor 272 outputs a voltage signal that corresponds to the size of the space 273. Thus, the first voltage output 731 and second voltage output 732 may be the voltage signals from an optical sensor. Additionally, the second sensor assembly 680 may include an optical sensor configured to sense the featureless element 660 through the membrane 206 to determine a vertical position of the carrier 630 within the second region 208, such as determining the size of the gap G2.

In some embodiments, the membrane 206 may be made of a non-conductive membrane (e.g., ceramic), and the sensors 272 of the sensor assembly 270, the sensors 272 of the first sensor assembly 670, and sensor of the second sensor assembly 680 may not be magnetic field detection sensors. For example, the aforementioned sensors may be any suitable distance sensor, such as a capacitance or induction distance sensor, including optical sensors when the membrane 206 is transparent.

In one embodiment, a process station comprises: a housing; a membrane disposed in the housing, the membrane isolating a first region within the housing from a second region within the housing; a first magnetic levitation actuator assembly disposed in the first region, the first magnetic levitation assembly including: a plurality of stators configured to levitate and drive a carrier within the second region; a plurality of sensor assemblies, each sensor assembly including: a first sensor configured to detect a first distance between the membrane and a first portion of a first upper surface of a first sinusoidal element of the carrier, the first upper surface defining a sinusoidal profile; and a second sensor configured to detect a second distance between the membrane and a second portion of the first upper surface of the first sinusoidal element, and wherein the second sensor is spaced apart from the first sensor by a spacing distance.

In one or more embodiments of the process station, the first sensor assembly further comprises a third sensor configured to detect a third distance between the membrane and a third portion of the first upper surface of the first sinusoidal element, and wherein the first sensor, second sensor, and third sensor are arranged in a linear array, and wherein the third sensor is spaced apart from the second sensor by the spacing distance.

In one or more embodiments of the process station, the distance is 120 degrees along a period of the sinusoidal profile.

In one or more embodiments of the process station, the process station further comprises a controller in communication with the first sensor, second sensor, and third sensor, the controller configured to use the first distance, second distance, and third distance to determine a vertical position and a horizontal position of the carrier within the second region.

In one or more embodiments of the process station, the first magnetic levitation actuator assembly further comprises a second sensor assembly configured to detect a size of a gap between the membrane and a first planar surface of a first featureless element of the carrier.

In one or more embodiments of the process station, the spacing distance is 90 degrees along a period of the sinusoidal profile.

In one or more embodiments of the process station, the first and second sensor each comprise: a base including a first side and a second side; at least one magnet disposed over the first side of the base, the at least one magnet generating magnetic flux; and a first sensor element and a second sensor element disposed over the second side, wherein the first sensor element and second sensor element are configured to measure magnetic flux density, and the magnetic flux generated by the at least one magnet is configured to pass through the first sensor element in a first direction and pass through the second sensor element in a second direction that is opposite to the first direction.

In one or more embodiments of the process station, the first and second sensor elements are at least one of a Hall Effect element, Giant magnetoresistance (GMR) element, or a Tunnel magnetoresistance (TMR) element.

In one embodiment, a magnetic levitation actuator assembly comprises: a linear stator; a first sensor assembly positioned adjacent to the linear stator, the first sensor assembly comprising a first sensor and a second sensor, the first sensor spaced apart from the second sensor by a spacing distance, wherein the first sensor and second sensor are each a magnetic sensor, the magnetic sensor comprising: at least one magnet disposed on a first side of a base, the at least one magnet generating a magnetic flux; and a first sensor element and a second sensor element disposed on a second side of the base, wherein the first sensor element and second sensor element are configured to measure magnetic flux density, wherein the magnetic flux generated by the at least one magnet is configured to pass through the first sensor element in a first direction and pass through the second sensor element in a second direction that is opposite to the first direction.

In one or more embodiments of the magnetic levitation actuator assembly, the magnetic levitation actuator assembly further comprises: a frame member, wherein the first sensor assembly and linear stator are disposed on opposing sides of the frame member.

In one or more embodiments of the magnetic levitation actuator assembly, the first sensor assembly further comprises a third sensor spaced apart from the second sensor by the spacing distance, wherein the first sensor, the second sensor, and the third sensor are arranged in a linear array, and wherein the third sensor also comprises the magnetic sensor.

In one or more embodiments of the magnetic levitation actuator assembly, the spacing distance is 120 degrees along a sinusoidal profile of a sinusoidal element coupled to a carrier.

In one or more embodiments of the magnetic levitation actuator assembly, the magnetic levitation actuator assembly further comprises a second sensor assembly.

In one or more embodiments of the magnetic levitation actuator assembly, the magnetic levitation actuator assembly further comprises a frame member, wherein the first sensor assembly, the second sensor assembly, and the linear stator are attached to the frame member, and wherein the frame member is disposed between the linear stator and the first sensor assembly and the second sensor assembly.

In one or more embodiments of the magnetic levitation actuator assembly, the spacing distance is 90 degrees along a period of a sinusoidal profile of a sinusoidal element coupled to a carrier.

In one embodiment, a method of operating a process station comprises: levitating a carrier with a plurality of linear stators of a magnetic levitation actuator assembly, wherein the magnetic levitation actuator assembly further comprises a first sensor assembly, and wherein a membrane is disposed between the carrier and the magnetic levitation actuator assembly; and detecting a horizontal position of the carrier using the first sensor assembly, wherein the first sensor assembly is disposed above an upper surface of a sinusoidal element coupled to the carrier, and wherein the upper surface is defined by a sinusoidal profile.

In one or more embodiments of the method of operating the process station, the method further comprises detecting a vertical position of the carrier using the first sensor assembly.

In one or more embodiments of the method of operating the process station, the method further comprises using the plurality of linear stators to adjust the horizontal position and/or vertical position of the carrier based on the detected horizontal position and vertical position.

In one or more embodiments of the method of operating the process station, the method further comprises detecting a vertical position of the carrier using a second sensor assembly of the magnetic levitation actuator assembly, wherein the second sensor assembly is disposed above a planar surface of the carrier.

In one or more embodiments of the method of operating the process station, the planar surface is an upper surface of a featureless element coupled to the carrier.

In one embodiment, a carrier comprises: a base; a first linear array of features coupled to the base; a first sinusoidal element coupled to the base and extending parallel to the first linear array of features, the first sinusoidal element including a first upper surface defining a first sinusoidal profile; and at least one support surface coupled to the base, the at least one support surface configured to support an object.

In one or more embodiments of the carrier, the first sinusoidal element and the features of the first linear array of features are formed from a ferromagnetic material.

In one or more embodiments of the carrier, the carrier further comprises a first magnetic levitation element coupled to the base, the first magnetic levitation element including the first sinusoidal element and the first linear array of features.

In one or more embodiments of the carrier, the carrier further comprises a second magnetic levitation element coupled to the base, the second magnetic levitation element including a second sinusoidal element and a second linear array of features, the second sinusoidal element including a second upper surface defining a second sinusoidal profile.

In one or more embodiments of the carrier, the first magnetic levitation element comprises a first rail and the second magnetic levitation element comprises a second rail, wherein the first rail is arranged parallel to the second rail.

In one or more embodiments of the carrier, the carrier further comprises a first support member and a second support member coupled to the base and disposed below the first linear array and the first sinusoidal element, each of the first support member and the second support member including a support surface of the at least one support surface.

In one or more embodiments of the carrier, the base comprises a ceramic material or a metal.

In one embodiment, a carrier comprises: a base; a first linear array of features coupled to the base; a first sinusoidal element coupled to the base and extending parallel to the first linear array, the first sinusoidal element including a first upper surface defining a first sinusoidal profile; a first featureless element coupled to the base and extending parallel to the first sinusoidal element, the first featureless element including a first planar upper surface; and at least one support surface coupled to the base, the at least one support surface configured to support an object.

In one or more embodiments of the carrier, the first featureless element is a portion of a planar surface of the base.

In one or more embodiments of the carrier, the first featureless element is at least partially embedded in the base.

In one or more embodiments of the carrier, the first sinusoidal element, the first featureless element, and the features of the first linear array of features are formed from a ferromagnetic material.

In one or more embodiments of the carrier, the carrier further comprises a first magnetic levitation element coupled to the base, the first magnetic levitation element including the first sinusoidal element, the first featureless element, and the first linear array of features.

In one or more embodiments of the carrier, the carrier further comprises a second magnetic levitation element coupled to the base, the second magnetic levitation element including: a second sinusoidal element including a second upper surface defining a second sinusoidal profile; a second featureless portion including a second planar upper surface; and a second linear array features.

In one or more embodiments of the carrier, the carrier further comprises a first support member and a second support member coupled to the base and disposed below the first linear array of features and the first sinusoidal element, each of the first support member and the second support member including a support surface of the at least one support surface.

In one or more embodiments of the carrier, the base comprises a ceramic material or a metal.

In one embodiment, a carrier comprises: a base including a first side and a second side; a first magnetic levitation element coupled to the first side of the base, the first magnetic levitation element including a first linear array of features and a first sinusoidal element, wherein the first sinusoidal element includes a first upper surface defining a first sinusoidal profile; a second magnetic levitation element coupled to the first side of the base, the second magnetic levitation element including a second linear array of features and a second sinusoidal element, wherein the second sinusoidal element includes a second upper surface defining a second sinusoidal profile, and wherein the first magnetic levitation element and the second magnetic levitation element are aligned in a first direction; a first support member coupled to the second side of the base; and a second support member coupled to the second side of the base, wherein the first support member and the second support member are disposed below the first magnetic levitation element and the second magnetic levitation element, and wherein the first support member and the second support member are configured to support an object.

In one or more embodiments of the carrier, the first magnetic levitation element and the second magnetic levitation element are formed from a ferromagnetic material.

In one or more embodiments of the carrier, the base comprises a ceramic material or a metal.

In one or more embodiments of the carrier, the first magnetic levitation element comprises a first featureless element, the first featureless element including a first planar upper surface; and the second magnetic levitation element comprises a second featureless element, the second featureless element including a second planar upper surface.

In one or more embodiments of the carrier, the first featureless element, the second featureless element, the first sinusoidal element, and the second sinusoidal element are formed from magnetic stainless steel.

In one embodiment, a method of determining a position of a carrier within a process station comprises: levitating a carrier within a process station, wherein the process station includes a membrane separating a first region of the process station from a second region of the process station, wherein the carrier is levitated in the second region, and wherein a first sensor assembly is disposed above a sinusoidal element of the carrier, the first sensor assembly comprising a first sensor, a second sensor, and a third sensor arranged in a linear array and spaced apart by a spacing distance; outputting a first signal from the first sensor based on a first detected magnetic flux density; outputting a second signal from the second sensor based on a second detected magnetic flux density; outputting a third signal from the third sensor based on a third detected magnetic flux density; averaging the first signal, second signal, and third signal to determine an average signal; and determining a first vertical position of the carrier within the second region by correlating the average signal to a size of a median gap between an underside of the membrane and a mid-line of a sinusoidal profile of the sinusoidal element.

In or more embodiments of the method of determining the position of the carrier within the process station, the method further comprises: moving the carrier to a target vertical position after determining that the first vertical position is outside of a threshold of the target vertical position.

In or more embodiments of the method of determining the position of the carrier within the process station, the spacing distance is 120 degrees along a period of the sinusoidal profile of the sinusoidal element.

In or more embodiments of the method of determining the position of the carrier within the process station, the method further comprises: inputting the first signal, second signal, and third signal into a Clarke transformation to generate a sine signal and a cosine signal.

In or more embodiments of the method of determining the position of the carrier within the process station, the method further comprises: inputting the sine signal and cosine signal into a sine-cosine decoder to generate a sawtooth signal.

In or more embodiments of the method of determining the position of the carrier within the process station, the method further comprises: analyzing the sawtooth signal to determine a horizontal position of the carrier within the second region.

In or more embodiments of the method of determining the position of the carrier within the process station, the method further comprises: analyzing the sawtooth signal to determine a distance traveled by the carrier.

In or more embodiments of the method of determining the position of the carrier within the process station, the analyzing of the sawtooth signal to determine the distance traveled by the carrier comprises: counting each full sawtooth in the sawtooth signal over a time interval, each full sawtooth corresponding to one period of the sinusoidal profile, the period corresponding to a first length value;

analyzing a partial sawtooth present in the sawtooth signal during in the time interval to determine a second length value; and multiplying the counted number of full saw-teeth by the first length value and adding the second length value.

In or more embodiments of the method of determining the position of the carrier within the process station, analyzing the partial sawtooth to determine the second length value comprises: correlating an end point of the partial sawtooth to a point along the period; correlating the point along the period to the second length value.

In or more embodiments of the method of determining the position of the carrier within the process station, the method further comprises: calibrating the sensor assembly, the calibration comprising: engaging the carrier with an underside of the membrane; determining the size of the median gap while the carrier is engaged with the membrane; comparing the determined size of the median gap to a reference gap size; and adjusting the output of the first, second, and third sensors by a factor based on the difference between the determined size of the median gap and the reference gap size.

In one embodiment, a method of determining a position of a carrier within a process station comprises: levitating a carrier within a process station, wherein the process station includes a membrane separating a first region of the process station from a second region of the process station, wherein the carrier is levitated in the second region, and wherein a first sensor assembly is disposed above a sinusoidal element having a sinusoidal profile positioned on the carrier, the first sensor assembly comprising a first sensor, a second sensor, and a third sensor arranged in a linear array and spaced apart by a spacing distance; outputting a first signal from the first sensor based on a first detected magnetic flux density over a time interval; outputting a second signal from the second sensor based on a second detected magnetic flux density over the time interval; outputting a third signal from the third sensor based on a third detected magnetic flux density over the time interval; inputting the first signal, second signal, and third signal into a Clarke transformation to generate a sine signal and a cosine signal; inputting the sine signal and cosine signal into a sine-cosine decoder to generate a sawtooth signal; and analyzing the sawtooth signal to determine a distance traveled by the carrier within the second region.

In one or more embodiments of the method of determining the position of the carrier within the process station, the analyzing of the sawtooth signal to determine the distance traveled by the carrier comprises: counting each full sawtooth in the sawtooth signal over the time interval, each full sawtooth corresponding to one period of the sinusoidal profile, the period corresponding to a first length value; analyzing a partial sawtooth present in the sawtooth signal during in the time interval to determine a second length value; and multiplying the counted number of full saw-teeth by the first length value and adding the second length value.

In one or more embodiments of the method of determining the position of the carrier within the process station, analyzing the partial sawtooth to determine the second length value comprises: correlating an end point of the partial sawtooth to a point along the period; correlating the point along the period to the second length value.

In one or more embodiments of the method of determining the position of the carrier within the process station, the spacing distance is 120 degrees along a period of the sinusoidal profile.

In one embodiment, a method of determining a position of a carrier within a process station comprises: levitating a carrier within a process station, wherein the process station includes a membrane separating a first region of the process station from a second region of the process station, wherein the carrier is levitated in the second region, and wherein a first sensor assembly is disposed above a sinusoidal element having a sinusoidal profile positioned on the carrier, and a vertical position sensor is disposed in the second region above a featureless element; outputting a first signal from a first sensor of the first sensor assembly, the first signal based on a first detected magnetic flux density; outputting a second signal from a second sensor of the first sensor assembly, the second signal based on a second detected magnetic flux density, and wherein the second sensor is spaced apart from the first sensor by a spacing distance; outputting a third signal from the vertical position sensor, the third signal based on a third detected magnetic flux density; analyzing the first signal and the second signal to determine a horizontal position of the carrier in the second region; and analyzing the third signal to determine a vertical position of the carrier.

In one or more embodiments of the method of determining the position of the carrier within the process station, analyzing the first signal and second signal to determine the horizontal position comprises: inputting the first signal and second signal into a decoder to generate a sawtooth signal; and analyzing the sawtooth signal to determine the horizontal position.

In one or more embodiments of the method of determining the position of the carrier within the process station, analyzing the sawtooth signal to determine the horizontal position comprises determine a distance traveled by the carrier over a time interval.

In one or more embodiments of the method of determining the position of the carrier within the process station, determining the distance traveled comprises: counting each full sawtooth in the sawtooth signal over the time interval, each full sawtooth corresponding to one period of the sinusoidal profile, the period corresponding to a first length value; analyzing a partial sawtooth present in the sawtooth signal during in the time interval to determine a second length value; and multiplying the counted number of full saw-teeth by the first length value and adding the second length value.

In one or more embodiments of the method of determining the position of the carrier within the process station, analyzing the third signal to determine the vertical position comprises: correlating the third signal with a size value of a gap between an underside of the membrane and an upper planar surface of the featureless element.

In one or more embodiments of the method of determining the position of the carrier within the process station, the spacing distance is 90 degrees along a period of the sinusoidal profile.

While the foregoing is directed to embodiments of the present disclosure, other and further embodiments of the disclosure may be devised without departing from the basic scope thereof, and the scope thereof is determined by the claims that follow.

What is claimed is:

1. A process station, comprising:
a housing;
a membrane disposed in the housing, the membrane isolating a first region within the housing from a second region within the housing;
a first magnetic levitation actuator assembly disposed in the first region, the first magnetic levitation actuator assembly including:

a plurality of stators configured to levitate and drive a carrier within the second region;
a plurality of sensor assemblies, each sensor assembly including:
a first sensor configured to detect a first distance between the membrane and a first portion of a first upper surface of a first sinusoidal element of the carrier, the first upper surface defining a sinusoidal profile; and
a second sensor configured to detect a second distance between the membrane and a second portion of the first upper surface of the first sinusoidal element, and wherein the second sensor is spaced apart from the first sensor by a spacing distance.

2. The process station of claim 1, each of the plurality of sensor assemblies further comprises:
a third sensor configured to detect a third distance between the membrane and a third portion of the first upper surface of the first sinusoidal element, and wherein the first sensor, second sensor, and third sensor are arranged in a linear array, and wherein the third sensor is spaced apart from the second sensor by the spacing distance.

3. The process station of claim 2, wherein the spacing distance is 120 degrees along a period of the sinusoidal profile.

4. The process station of claim 2, further comprising:
a controller in communication with the first sensor, second sensor, and third sensor, the controller configured to use the first distance, second distance, and third distance to determine a vertical position and a horizontal position of the carrier within the second region.

5. The process station of claim 1, wherein the plurality of sensor assemblies comprises a plurality of first sensor assemblies, and wherein the first magnetic levitation actuator assembly further comprises:
a second sensor assembly configured to detect a size of a gap between the membrane and a first planar surface of a first featureless element of the carrier.

6. The process station of claim 5, wherein the spacing distance is 90 degrees along a period of the sinusoidal profile.

7. The process station of claim 1, wherein the first and second sensors each comprise:
a base including a first side and a second side;
at least one magnet disposed over the first side of the base, the at least one magnet generating magnetic flux; and
a first sensor element and a second sensor element disposed over the second side, wherein the first sensor element and second sensor element are configured to measure magnetic flux density, and the magnetic flux generated by the at least one magnet is configured to pass through the first sensor element in a first direction and pass through the second sensor element in a second direction that is opposite to the first direction.

8. The process station of claim 7, wherein the first and second sensor elements are at least one of a Hall Effect element, Giant magnetoresistance (GMR) element, or a Tunnel magnetoresistance (TMR) element.

9. A magnetic levitation actuator assembly, comprising:
a linear stator;
a first sensor assembly positioned adjacent to the linear stator, the first sensor assembly comprising a first sensor and a second sensor, the first sensor spaced apart from the second sensor by a spacing distance, wherein the first sensor and second sensor are each a magnetic sensor, the magnetic sensor comprising:

at least one magnet disposed on a first side of a base, the at least one magnet generating a magnetic flux; and a first sensor element and a second sensor element disposed on a second side of the base, wherein the first sensor element and second sensor element are configured to measure magnetic flux density, wherein the magnetic flux generated by the at least one magnet is configured to pass through the first sensor element in a first direction and pass through the second sensor element in a second direction that is opposite to the first direction.

10. The magnetic levitation actuator assembly of claim 9, further comprising:

a frame member, wherein the first sensor assembly and linear stator are disposed on opposing sides of the frame member.

11. The magnetic levitation actuator assembly of claim 9, wherein the first sensor assembly further comprises a third sensor spaced apart from the second sensor by the spacing distance, wherein the first sensor, the second sensor, and the third sensor are arranged in a linear array, and wherein the third sensor also comprises the magnetic sensor.

12. The magnetic levitation actuator assembly of claim 11, wherein the spacing distance is 120 degrees along a sinusoidal profile of a sinusoidal element coupled to a carrier.

13. The magnetic levitation actuator assembly of claim 9, further comprising:

a second sensor assembly.

14. The magnetic levitation actuator assembly of claim 13, further comprising:

a frame member, wherein the first sensor assembly, the second sensor assembly, and the linear stator are attached to the frame member, and wherein the linear stator is positioned on a first side of the frame member and the first sensor assembly and the second sensor assembly are positioned on a second side of the frame member.

15. The magnetic levitation actuator assembly of claim 9, wherein the spacing distance is 90 degrees along a period of a sinusoidal profile of a sinusoidal element coupled to a carrier.

16. A method of operating a process station, comprising:

levitating a carrier with a plurality of linear stators of a magnetic levitation actuator assembly, wherein the magnetic levitation actuator assembly further comprises a first sensor assembly, and wherein a membrane is disposed between the carrier and the magnetic levitation actuator assembly; and detecting a horizontal position of the carrier using the first sensor assembly, wherein the first sensor assembly is disposed above an upper surface of a sinusoidal element coupled to the carrier, and wherein the upper surface is defined by a sinusoidal profile.

17. The method of claim 16, further comprising:

detecting a vertical position of the carrier using the first sensor assembly.

18. The method of claim 16, further comprising:

using the plurality of linear stators to adjust the horizontal position and/or vertical position of the carrier based on the detected horizontal position and vertical position.

19. The method of claim 16, further comprising:

detecting a vertical position of the carrier using a second sensor assembly of the magnetic levitation actuator assembly, wherein the second sensor assembly is disposed above a planar surface of the carrier.

20. The method of claim 19, wherein the planar surface is an upper surface of a featureless element coupled to the carrier.

\* \* \* \* \*